United States Patent
Jung et al.

(10) Patent No.: US 11,574,673 B2
(45) Date of Patent: Feb. 7, 2023

(54) CALIBRATION CONTROL CIRCUIT AND STORAGE DEVICE COMPRISING THE CALIBRATION CONTROL CIRCUIT

(71) Applicant: SAMSUNG ELECTRONICS CO., LTD., Suwon-si (KR)

(72) Inventors: Younghyun Jung, Seongnam-si (KR); Joungyeal Kim, Yongin-si (KR); Hyunbo Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 140 days.

(21) Appl. No.: 17/205,535

(22) Filed: Mar. 18, 2021

(65) Prior Publication Data

US 2022/0013163 A1    Jan. 13, 2022

(30) Foreign Application Priority Data

Jul. 7, 2020    (KR) .......................... 10-2020-0083438

(51) Int. Cl.
*G11C 11/4093* (2006.01)
*G11C 11/4074* (2006.01)

(52) U.S. Cl.
CPC ...... *G11C 11/4093* (2013.01); *G11C 11/4074* (2013.01)

(58) Field of Classification Search
None
See application file for complete search history.

(56) References Cited

U.S. PATENT DOCUMENTS

| 7,170,313 | B2 | 1/2007 | Shin |
| 7,215,128 | B2 | 5/2007 | Fujisawa |
| 7,714,763 | B2 | 5/2010 | Kim et al. |
| 7,853,842 | B2 | 12/2010 | Kim et al. |
| 7,944,233 | B1 | 5/2011 | Lee |
| 7,994,812 | B2 | 8/2011 | Osanai et al. |
| 8,307,270 | B2 | 11/2012 | Kim et al. |
| 9,805,787 | B2 | 10/2017 | Ha |
| 2003/0132786 | A1 | 7/2003 | Styduhar |
| 2011/0074462 | A1* | 3/2011 | Chung ............... H03K 19/0005 326/30 |
| 2011/0222359 | A1 | 9/2011 | Do et al. |
| 2015/0270010 | A1* | 9/2015 | Kang .................. G11C 29/022 365/185.22 |
| 2017/0020770 | A1 | 1/2017 | Tabron et al. |
| 2019/0259429 | A1* | 8/2019 | Heo ......................... G11C 7/14 |

FOREIGN PATENT DOCUMENTS

KR    1020170061418    6/2017

* cited by examiner

*Primary Examiner* — Anh Q Tran
(74) *Attorney, Agent, or Firm* — F. Chau & Associates, LLC

(57) ABSTRACT

A memory device includes a calibration circuit configured to perform a ZQ calibration operation according to a calibration command signal and a calibration power voltage, and a calibration control circuit configured to determine the calibration command signal based on a comparison result obtained by comparing the calibration power voltage level with at least one reference voltage level.

20 Claims, 17 Drawing Sheets

CALIBRATION CONTROL CIRCUIT AND STORAGE DEVICE COMPRISING THE CALIBRATION CONTROL CIRCUIT

CROSS-REFERENCE TO RELATED APPLICATIONS

This application claims priority under 35 U.S.C. § 119 to Korean Patent Application No. 10-2020-0083438, filed on Jul. 7, 2020 in the Korean Intellectual Property Office, the disclosure of which is incorporated by reference herein in its entirety.

TECHNICAL FIELD

Embodiments of the inventive concept relate to a calibration control circuit, and more particularly, to a calibration control circuit that outputs a calibration command signal, and a memory device including the calibration control circuit.

DISCUSSION OF RELATED ART

The capacity and speed of a semiconductor memory device, which is widely used in high-performance electronic systems, is increasing. Examples of a memory device include dynamic random access memory (DRAM). DRAM is a volatile memory and determines data according to charges stored in a capacitor.

To prevent distortion of signals transmitted between a memory controller and the memory device, an on-die termination (ODT) circuit and/or an off chip driver (OCD) circuit may be included in the memory device. A resistance (or an impedance) of an ODT/OCD circuit is controlled by control codes generated in a calibration circuit. The calibration circuit performs a ZQ calibration operation in which pull-up and pull-down codes are generated as the control codes, the pull-up and pull-down codes changing according to conditions such as, for example, process, voltage, and temperature (PVT).

SUMMARY

Embodiments of the inventive concept provide a calibration control circuit, which outputs a calibration command signal according to a level of a power voltage input to a calibration circuit, a memory device including the same, and an operation method of the memory device.

According to one or more embodiments, a memory device includes a calibration circuit performing a ZQ calibration operation according to a calibration command signal and a calibration power voltage, and a calibration control circuit configured to determine the calibration command signal based on a comparison result obtained by comparing a level of the calibration power voltage with a level of at least one reference voltage.

According to one or more embodiments, a calibration control circuit includes a comparator configured to obtain a comparison result by comparing a calibration power voltage, which is input to a calibration circuit configured to perform a ZQ calibration operation, with at least one reference voltage, and a command signal output unit configured to output a calibration command signal used to determine whether the calibration circuit performs the ZQ calibration operation based on the comparison result.

According to one or more embodiments, an operation method of a memory device includes comparing a calibration power voltage, which is input to a calibration circuit configured to perform a ZQ calibration operation, with at least one reference voltage, and determining a logic state of a calibration command signal used to determine whether the calibration circuit performs the ZQ calibration operation based on a comparison result obtained by comparing the calibration power voltage with the reference voltage.

BRIEF DESCRIPTION OF THE DRAWINGS

Embodiments of the inventive concept will be more clearly understood from the following detailed description taken in conjunction with the accompanying drawings, in which.

DETAILED DESCRIPTION

Figure 1:
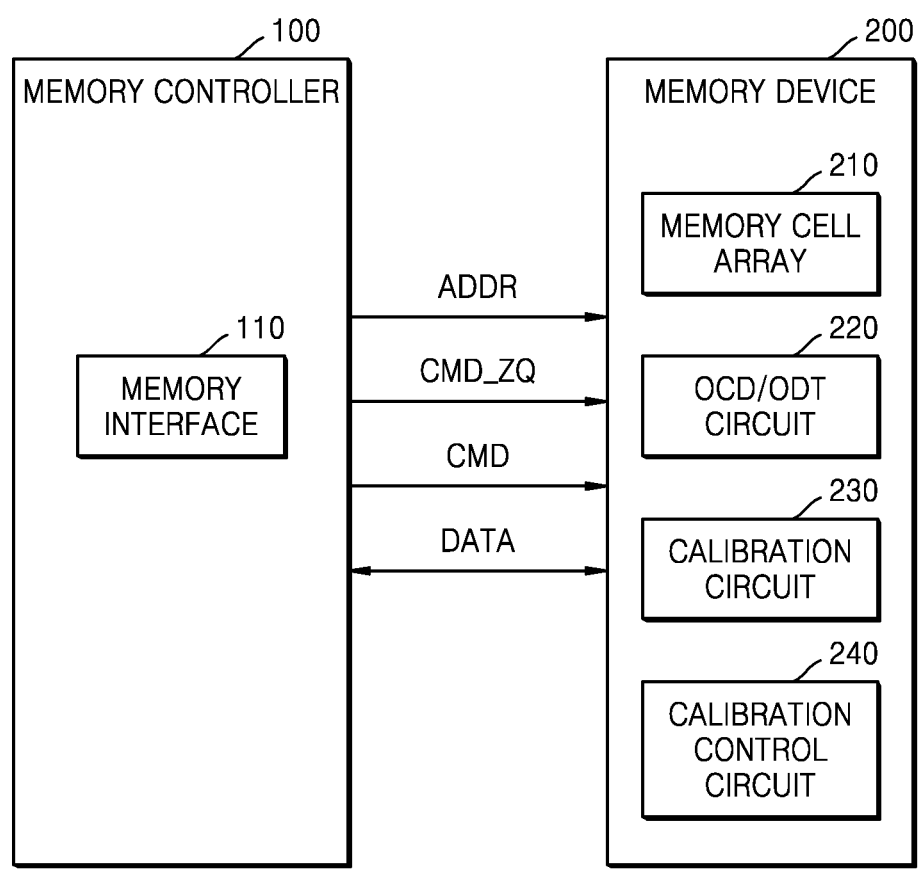
FIG. 1 is a block diagram of a memory system according to an embodiment.

Embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

As used herein, the singular forms "a", "an" and "the" are intended to include the plural forms as well, unless the context clearly indicates otherwise.

The term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

FIG. 1 is a block diagram of a memory system according to an embodiment.

Referring to FIG. 1, the memory system may include a memory controller 100 and a memory device 200. The memory controller 100 transmits various signals to the memory device 200 and controls memory operations such as, for example, a write operation and a read operation. For example, the memory controller 100 may include a memory interface 110 and may receive data DATA from a memory cell array 210 by providing a command CMD and an address ADDR to the memory device 200.

The command CMD may include commands for normal memory operations such as, for example, a write operation and a read operation. The memory controller 100 may provide the command CMD for various control operations in the memory device 200, and the memory controller 100 may, for example, provide a calibration command CMD_ZQ to the memory device 200. The memory device 200 may set a termination resistance value of an On-Die Termination (ODT) circuit in the memory device 200 or may set a resistance value of an output driver (or an Off Chip Driver (OCD) circuit) by performing a calibration operation during initial operation or performing a calibration operation in response to a calibration command CMD_ZQ.

The memory controller 100 may access the memory device 200 according to a request from a host device. The memory controller 100 may communicate with a host device according to various protocols. For example, the memory controller 100 may communicate with the host device according to an interface protocol such as Peripheral Component Interconnect-Express (PCI-E), Advanced Technology Attachment (ATA), Serial ATA (SATA), Parallel ATA (PATA), or serial attached SCSI (SAS). Other interface protocols such as, for example, a Universal Serial Bus (USB), a Multi-Media Card (MMC), an Enhanced Small Disk Interface (ESDI), and Integrated Drive Electronics (IDE) may be applied as protocols between the host device and the memory controller 100, in addition to the above interface protocol. However, embodiments of the present inventive concept are not limited thereto.

The memory device 200 may include various types of memories. Examples of the memory device 200 include, but are not limited to, Dynamic Random Access Memory (DRAM) such as Double Data Rate Synchronous Dynamic Random Access Memory (DDR SDRAM), Low Power Double Data Rate (LPDDR) SDRAM, Graphics Double Data Rate (GDDR) SDRAM, or Rambus Dynamic Random Access Memory (RDRAM). However, embodiments of the present inventive concept are not limited thereto. For example, according to embodiments, the memory device 200 may include non-volatile memory such as Magnetic RAM (MRAM), Ferroelectric RAM (FRAM), Phase change RAM (PRAM), or Resistive RAM (ReRAM).

The memory device 200 may communicate with the memory controller 100 via an interface according to various standards. For example, the memory controller 100 and the memory device 200 may communicate via an interface according to Low Power Double Data Rate 4 (LPDDR4), LPDDR4X, LPDDR5, and other standards.

The memory device 200 may include a memory cell array 210, an OCD/ODT circuit 220, a calibration circuit 230, and a calibration control circuit 240. According to an embodiment, the memory device 200 may include an OCD circuit and an ODT circuit. However, embodiments of the present inventive concept are not limited thereto. In an embodiment, the OCD circuit and the ODT circuit may be separated from each other in the memory device 200. For example, in an embodiment, the OCD circuit and the ODT circuit may be implemented by different hardware modules in the memory device 200. Alternatively, according to an embodiment, the OCD circuit may include a pull up circuit and a pull down circuit, and any one of the pull up circuit and the pull down circuit may be used as the ODT circuit. For example, in an operation of outputting the data DATA, the OCD circuit may perform a signal output operation using the pull up circuit and the pull down circuit, and in an operation of receiving the data DATA, the pull up circuit of the OCD circuit may be used as an ODT circuit for providing a termination resistance to a line to which the data DATA is input. The OCD/ODT circuit 220 may adjust a resistance (or an impedance) of the OCD/ODT circuit 220 to prevent or reduce distortion of signals transmitted between the memory controller 100 and the memory device 200.

The calibration circuit 230 may perform a ZQ calibration operation in which a pull up code or a pull down code is generated to adjust the resistance of the OCD/ODT circuit 220. The calibration circuit 230 may generate control codes for adjusting a resistance value of the OCD/ODT circuit 220. The calibration circuit 230 may perform a calibration operation as the calibration circuit 230 enters a ZQ calibration mode periodically or in an initial stage of the memory device 200. In the ZQ calibration operation, the control codes may be generated based on a feedback operation. For example, the calibration circuit 230 may include a resistance circuit having the same characteristics as a pull up resistance and/or a pull down resistance included in the OCD/ODT circuit 220. The calibration circuit 230 may generate a pull up code for adjusting a resistance value of the pull up circuit of the OCD/ODT circuit 220 or may generate a pull down code for adjusting a resistance value of the pull down circuit of the OCD/ODT circuit 220. The generated pull up code and/or pull down code may be set or stored in the memory device 200 and then may be used to provide the on-die termination resistance in operations of writing and reading the data DATA or to adjust a resistance value (or an output intensity) of the OCD circuit (or an output driver circuit).

The calibration control circuit 240 may determine a logic level of a calibration command signal based on a result of comparing a level of a reference voltage with a level or a calibration power voltage that is input to the calibration circuit 230. For example, when the calibration power voltage is higher than the reference voltage, the calibration control circuit 240 may transmit the calibration command signal having a logic high level to the calibration circuit 230. The calibration command signal of the logic high level is a signal commanding the calibration circuit 230 to perform the ZQ calibration operation, and the calibration circuit 230 may generate various control codes to perform the ZQ calibration operation.

Figure 2:
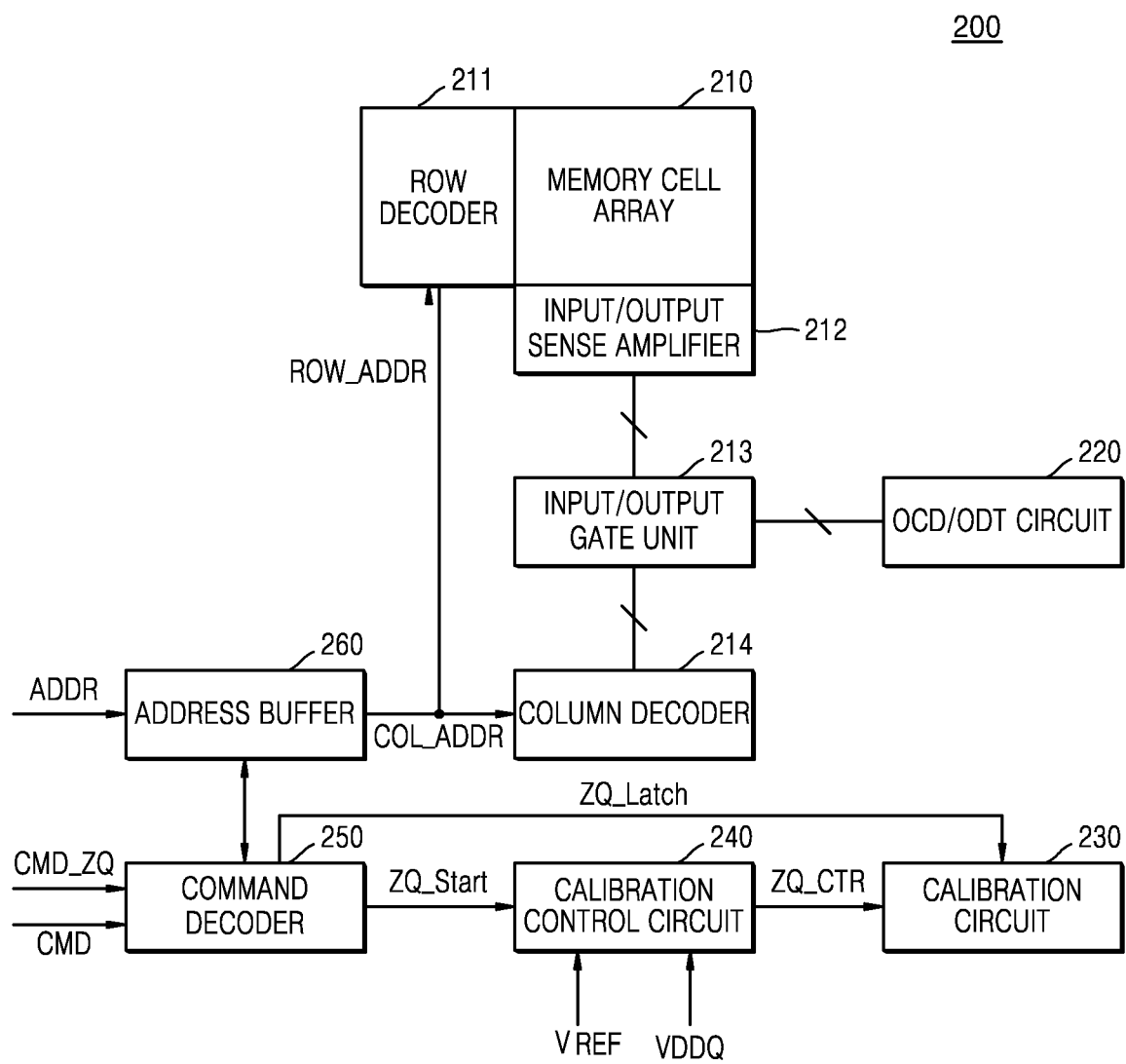
FIG. 2 is a block diagram of an example of a memory device of FIG. 1.

FIG. 2 is a block diagram of an example of the memory device 200 of FIG. 1.

The memory device 200 may include the memory cell array 210, the OCD/ODT circuit 220, the calibration circuit 230, the calibration control circuit 240, a command decoder 250, and an address buffer 260. The memory device 200 may further include various components to write or read data to or from a memory cell of the memory cell array 210 that corresponds to an address. For example, the memory device 200 may further include a row decoder 211 for selecting a row of the memory cell array 210, a column decoder 214 for selecting a column, an input/output sense amplifier 212, and an input/output gating unit 213 for performing gating of input/output data.

The command decoder 250 may decode control signals regarding a memory operation by receiving the command CMD from the memory controller 100 or a host device, and may also provide various control signals to components included in the memory device 200. According to an embodiment, the command decoder 250 may receive a command signal CMD regarding data write/delete/read operations and may perform operations in response to the received command signal CMD. The address buffer 260 may receive an address ADDR provided from the memory controller 100. The address ADDR may include a row address ROW_ADDR for indicating a row of the memory cell array 210 and a column address COL_ADDR for indicating a column of the memory cell array 210. For example, the command decoder 250 may receive, from the memory controller 100, the command signal CMD controlling the writing of data, and the address buffer 260 may receive an address ADDR indicating on which memory cell of the memory cell array 210 the data is to be written. The memory device 200 may determine which operation will be performed on which memory cell in response to the command signal CMD and the address ADDR.

The input/output gating unit 213 may provide the read data from the memory cell array 210 to a device external to the memory device 200 through the OCD/ODT circuit 220. Also, an input buffer may be disposed inside or outside the OCD/ODT circuit 220, and in the data write operation, the data may be provided to the memory cell array 210 through the input buffer and the input/output gating unit 213.

The command decoder 250 may receive the calibration command CMD_ZQ from the memory controller 100 or the host device and may control a calibration-related operation according to the received calibration command CMD_ZQ. The command decoder 250 may receive the command CMD regarding writing/deletion/reading of the data and the calibration command CMD_ZQ as a code including a series of bits. However, embodiments of the present inventive concept are not limited thereto. The command decoder 250 may receive the command CMD and the calibration command CMD_ZQ as separate codes. The calibration command CMD_ZQ may include signals associated with a calibration start signal ZQ_Start, a calibration block signal, and a calibration latch signal ZQ_Latch, and the command decoder 250 may decode the above signals and thus may provide command signals to at least one of the calibration control circuit 240 and the calibration circuit 230. The calibration control circuit 240 may receive at least one signal from the command decoder 250 and may determine a logic state of a calibration command signal ZQ_CTR, which is provided to the calibration circuit 230, in response to the received signal. The determination of the calibration command signal by the calibration control circuit 240 will be described below in detail with reference to FIGS. 6 to 18.

The calibration circuit 230 may receive power voltages related to voltage levels, and each power voltage may be related to a type of a calibration operation. For example, a high power voltage level VDDQ_HIGH of about 0.5 V may be a level of a power voltage that indicates execution of the calibration operation, and a low power voltage level VDDQ_LOW of about 0.3 V may be a level of a power voltage that indicates non-execution of the calibration operation. The power voltage VDDQ may be received by the calibration circuit 230, and may also be referred to herein as a calibration power voltage.

Figure 3:
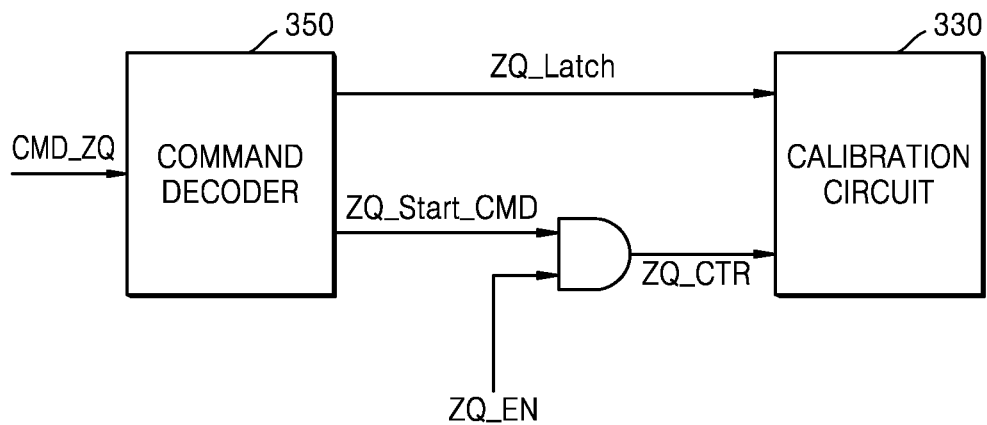
FIG. 3 is a block diagram of an example of outputting an existing calibration command signal.

FIG. 3 is a block diagram of an example of outputting a calibration command signal ZQ_CTR.

Referring to FIG. 3, a command decoder 350 of a memory device may receive the calibration command CMD_ZQ from the memory controller or the host device. Some aspects of the command decoder 350 may be the same as or similar to some aspects of the command decoder 250 previously described with reference to FIG. 2. For convenience of explanation, a further description of such aspects may be omitted. The command decoder 350 may generate a calibration start signal ZQ_Start_CMD and a calibration latch signal ZQ_Latch by decoding the calibration command CMD_ZQ.

The command decoder 350 may output the calibration start signal ZQ_Start_CMD to perform a ZQ calibration operation and compare a calibration enable signal ZQ_EN, which is received from the memory controller or the host device, with the calibration start signal ZQ_Start_CMD, thereby determining a logic state of the calibration command signal ZQ_CTR. For example, when both the calibration enable signal ZQ_EN and the calibration start signal ZQ_Start_CMD are high logic level signals, the signals thereby indicating performing of the ZQ calibration operation, the memory device may output the calibration command signal ZQ_CTR of logic high. Alternatively, when at least one of the calibration enable signal ZQ_EN and the calibration start signal ZQ_Start_CMD is a low logic level signal, the memory device may determine that the ZQ calibration operation is unnecessary, and thus, may output the calibration command signal ZQ_CTR of a low logic level.

When a certain period of time has passed after the memory device starts performing the ZQ calibration operation, the command decoder 350 may transmit the calibration latch signal ZQ_Latch to a calibration circuit 330. Some aspects of the calibration circuit 330 may be the same as or similar to some aspects of the calibration circuit 230 described with reference to FIGS. 1 and 2. For convenience of explanation, a further description of such aspects may be omitted. When receiving the calibration latch signal ZQ_Latch, the calibration circuit 330 may load a ZQ code. The ZQ code may be provided to the OCD/ODT circuit by the calibration circuit 330 to allow the memory device to perform the ZQ calibration operation, and as the calibration circuit 330 loads the ZQ code in response to the calibration latch signal ZQ_Latch, the memory device may determine whether to keep performing the ZQ calibration operation.

Figure 4:
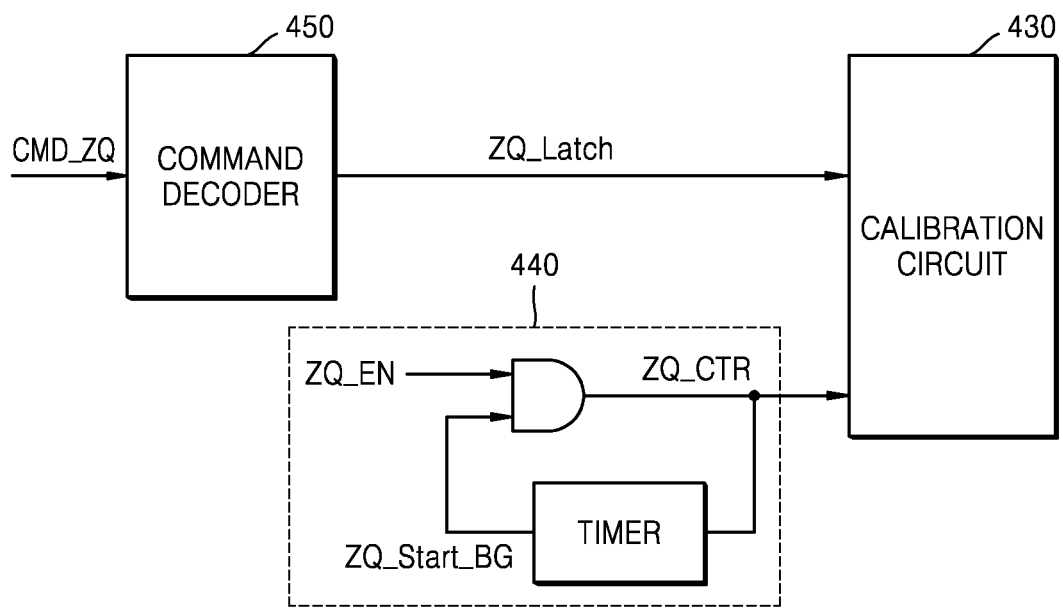
FIG. 4 is a block diagram of another example of outputting an existing calibration command signal.

FIG. 4 is a block diagram of another example of outputting a calibration command signal.

The embodiment of FIG. 3 shows that the calibration command signal ZQ_CTR generated as a command for performing the ZQ calibration operation is received from the memory controller or the host device, and the embodiment of FIG. 4 shows that a background calibration start signal ZQ_Start_BG is periodically generated from a feedback circuit 440 including a timer when the calibration enable signal ZQ_EN is input from the memory controller and/or the host device.

When receiving the calibration enable signal ZQ_EN from the memory controller or the host device, the memory device according to an embodiment may output the calibration command signal ZQ_CTR according to logic states of the calibration enable signal ZQ_EN and the background calibration start signal ZQ_Start_BG. The timer of the feedback circuit 440 may output the background calibration start signal ZQ_Start_BG of which the logic state is the same as that of the calibration command signal ZQ_CTR after a certain period of time has passed after receiving the calibration command signal ZQ_CTR. Then, the memory device may output the calibration command signal ZQ_CTR according to the logic states of the background calibration start signal ZQ_Start_BG and the calibration enable signal ZQ_EN.

For example, the timer of the feedback circuit 440 may output the background calibration start signal ZQ_Start_BG of a logic high level when the calibration command signal ZQ_CTR of a high logic level is output. Then, the memory device may output the calibration command signal ZQ_CTR of a logic high level again when the calibration enable signal ZQ_EN of a logic high level is input. However, when the calibration enable signal ZQ_EN of a low logic level is input, although the background calibration start signal ZQ_Start_BG of a high logic level is output, because it is determined that the ZQ calibration operation is unnecessary, the memory device may output the calibration command signal ZQ_CTR of a low logic level.

Some aspects of a calibration circuit 430 and a command decoder 450 illustrated in FIG. 4 may be the same as or similar to some aspects of the calibration circuit 230 and the command decoder 250 previously described with reference to FIGS. 1 and 2, respectively. For convenience of explanation, a further description of such aspects may be omitted. A description that the ZQ code is loaded by a calibration circuit 430 as a command decoder 450 outputs the calibration latch signal ZQ_Latch is provided with reference to FIG. 3. Thus, for convenience of explanation, a further detailed description thereof will be omitted.

Figure 5A:
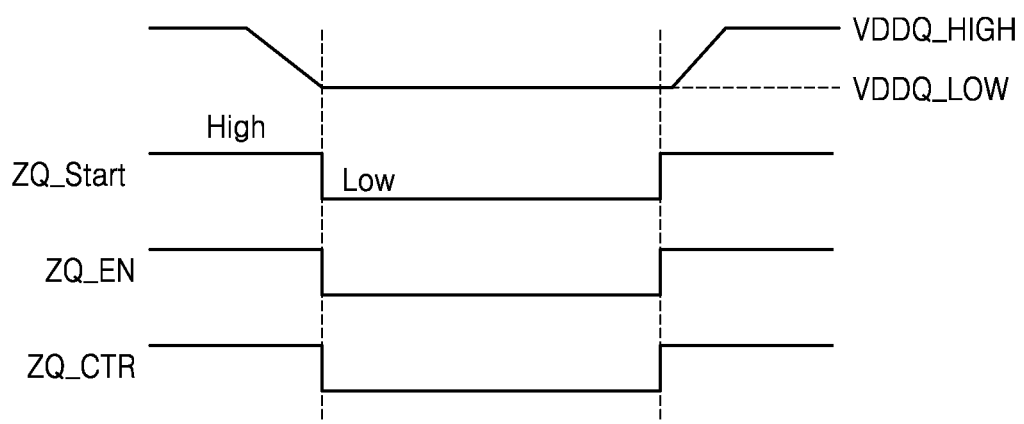
FIGS. 5A and 5B are timing diagrams of signals that are input to a memory device of FIGS. 3 and 4.
Figure 5B:
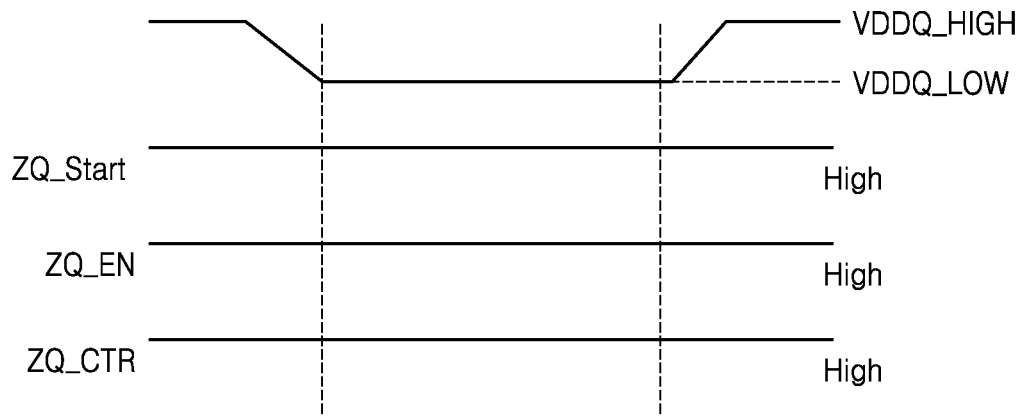

FIGS. 5A and 5B are timing diagrams of signals that are input to the memory device of FIGS. 3 and 4.

FIG. 5A shows that the calibration circuit receives the calibration start signal ZQ_Start and/or the calibration enable signal ZQ_EN corresponding to a state of the power voltage VDDQ in an ideal situation in which a command and a power voltage for the ZQ calibration operation are provided from the memory controller or the host device, for example, in a situation in which the memory device performs an operation according to the Joint Electron Device Engineering Council (JEDEC) Specification. For example, the high power voltage level VDDQ_HIGH corresponds to a high logic level of the calibration start signal ZQ_Start and the calibration enable signal ZQ_EN, and the low power voltage level VDDQ_LOW corresponds to a low logic level of the calibration start signal ZQ_Start and the calibration enable signal ZQ_EN. The high power voltage level VDDQ_HIGH is set to have a higher level than an average voltage of the power voltage VDDQ, and the low power voltage level VDDQ_LOW is set to have a lower level than the average voltage level of the power voltage VDDQ. For example, the high power voltage level VDDQ_HIGH may be about 0.5 V, and the low power voltage level VDDQ_LOW may be above about 0.3 V. Accordingly, the memory device may generate the calibration command signal ZQ_CTR corresponding to the power voltage VDDQ in an ideal situation.

On the contrary, FIG. 5B is a timing diagram corresponding to when the memory device violates the JEDEC Specification or the power voltage VDDQ fails to be synchronized with a timing of the calibration command signal ZQ_CTR. When the low power voltage level VDDQ_LOW is applied, the memory device should be controlled not to perform the ZQ calibration operation by generating the calibration command signal ZQ_CTR of a low logic level as shown in FIG. 5A. However, a high logic level of the calibration start signal ZQ_Start and the calibration enable signal ZQ_EN are still applied, and the calibration circuit generates the calibration command signal ZQ_CTR of a high logic level. As a result, the calibration circuit may perform the ZQ calibration operation, which results in unnecessary power consumption.

Figure 6:
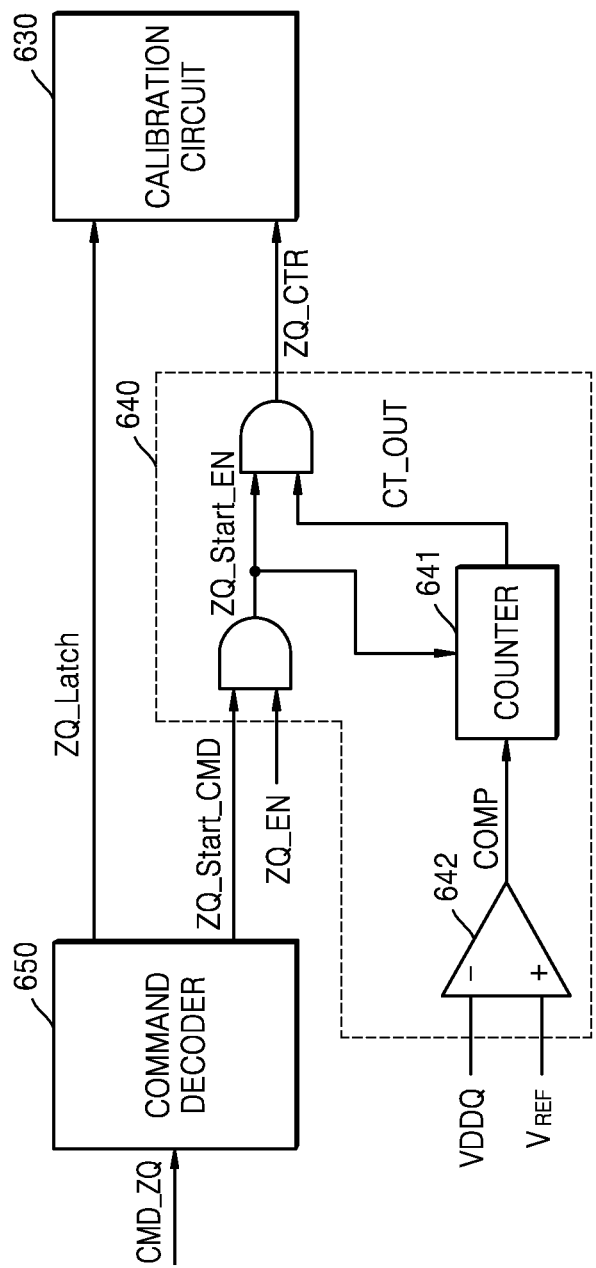
FIG. 6 shows an example of a calibration control circuit including a counter.
Figure 7:
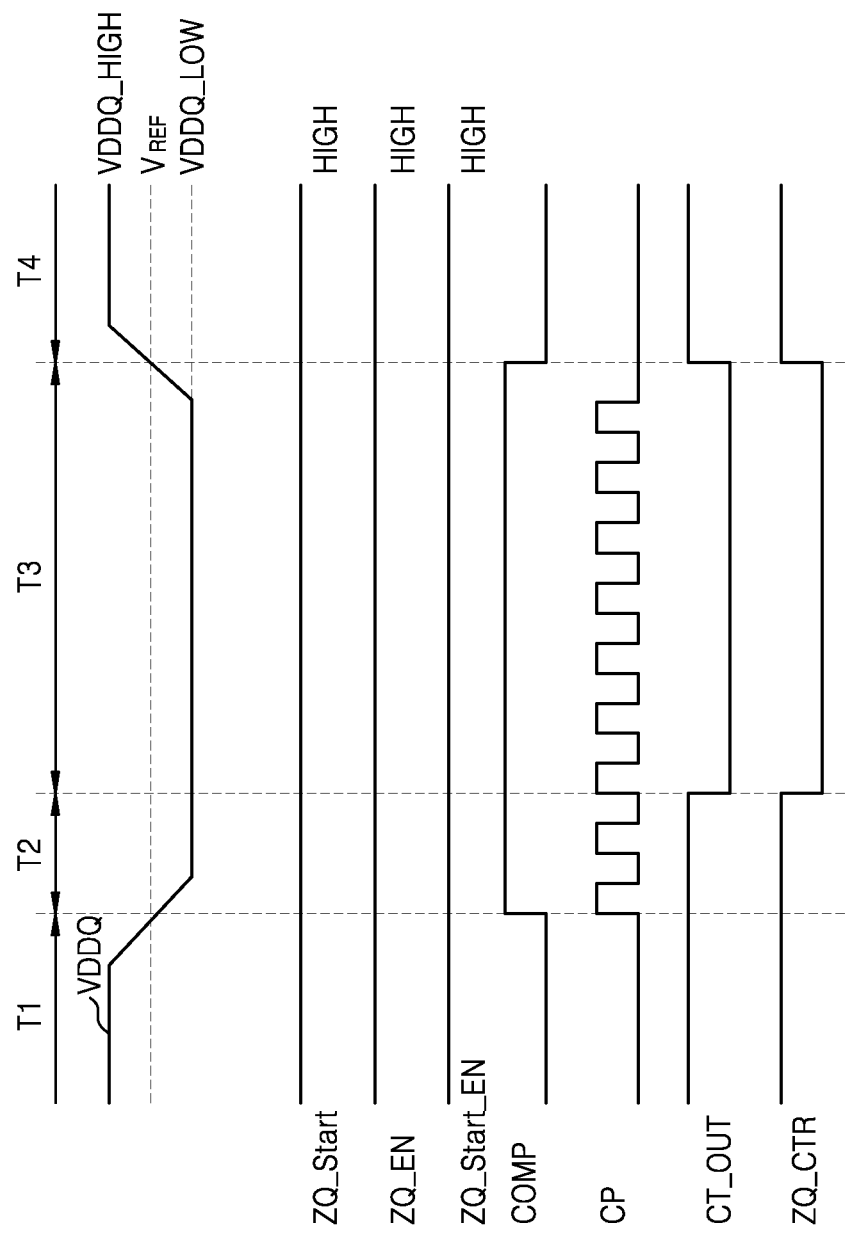
FIG. 7 is a timing diagram of signals that are input to the calibration control circuit of FIG. 6.
Figure 8:
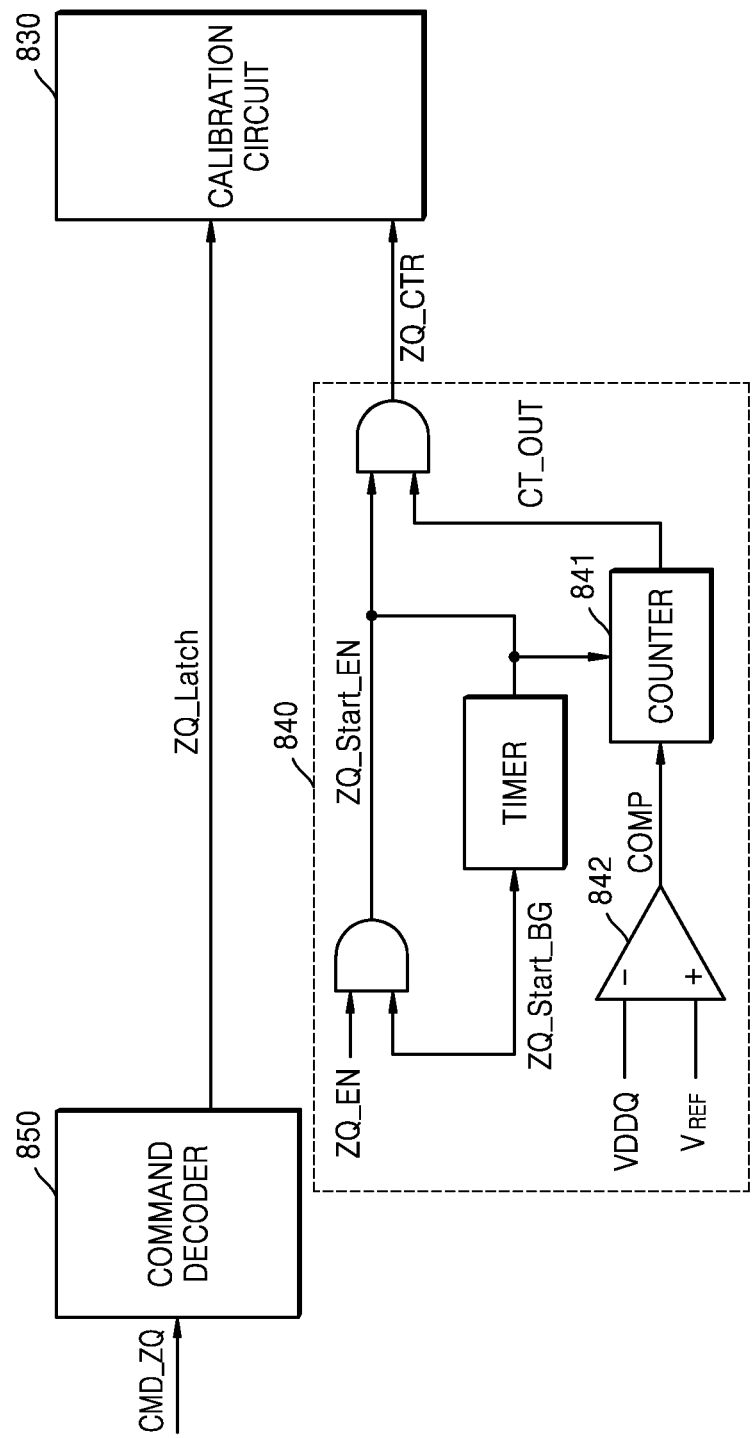
FIGS. 8 and 9 show other examples of a calibration control circuit including a counter.

FIGS. 6 to 8 show examples of a calibration control circuit including a counter.

To prevent unnecessary power consumption due to unnecessary execution of the ZQ calibration operation as shown in the embodiments of FIGS. 3 to 5B, an embodiment described herein may include a calibration control circuit 640 that compares a level of the power voltage VDDQ with a level of the reference voltage $V_{REF}$. Some aspects of the calibration control circuit 640 may be the same as or similar to some aspects of the calibration control circuit 240 described with reference to FIGS. 1 and 2. For convenience of explanation, a further description of such aspects may be omitted. When a certain period of time has passed after the memory device starts performing the ZQ calibration operation, a command decoder 650 may transmit the calibration latch signal ZQ_Latch to a calibration circuit 630. Some aspects of the command decoder 650 and the calibration circuit 630 may be similar to or the same as some aspects of the command decoder 250 and the calibration circuit 230 described with reference to FIGS. 1 and 2, respectively. For convenience of explanation, a further description of such aspects may be omitted. After receiving the calibration latch signal ZQ_Latch, the calibration circuit 630 may load the ZQ code. The ZQ code may be provided to the OCD/ODT circuit by the calibration circuit 630 to allow the memory device to perform the ZQ calibration operation, and as the calibration circuit 630 loads the ZQ code in response to the calibration latch signal ZQ_Latch, the memory device may determine whether to keep performing the ZQ calibration operation.

The calibration control circuit 640 of the memory device according to an embodiment of FIG. 6 may output the calibration start enable signal ZQ_Start_EN according to the calibration start signal ZQ_Start_CMD and the calibration enable signal ZQ_EN. According to logic levels of the calibration start signal ZQ_Start_CMD and the calibration enable signal ZQ_EN, the calibration control circuit 640 may determine a logic state of the calibration start enable signal ZQ_Start_EN. For example, the calibration control circuit 640 may output, through an AND gate, the calibration start enable signal ZQ_Start_EN of a high logic level when both the calibration start signal ZQ_Start_CMD and the calibration enable signal ZQ_EN are high logic level signals.

The power voltage VDDQ may be classified to have a high logic level and a low logic level according to voltage levels, and the voltage levels may respectively correspond to different operation modes of the calibration circuit 630. For example, the high power voltage level VDDQ_HIGH may be a level of the power voltage VDDQ that is input to the calibration circuit 630 while the ZQ calibration operation is performed, and the low power voltage level VDDQ_LOW may be a level of the power voltage VDDQ that is input to the calibration circuit 630 while the ZQ calibration operation is not performed.

A comparator 642 of the calibration control circuit 640 according to an embodiment may compare the power voltage VDDQ with the reference voltage $V_{REF}$, and thus, may generate a comparison signal COMP. For example, a level of the reference voltage $V_{REF}$ may be between the high power voltage level VDDQ_HIGH and the low power voltage level VDDQ_LOW and may be an average of the high power voltage level VDDQ_HIGH and the low power voltage level VDDQ_LOW. According to an embodiment, the memory device may adjust the level of the reference voltage $V_{REF}$ based on an amount of power consumed to perform the ZQ calibration operation. For example, the memory device may measure the amount of power consumed to perform the ZQ calibration operation, and when it is determined that the measured amount of power is greater than threshold power consumption, the level of the reference voltage $V_{REF}$ may be shifted to the higher voltage level than the previously set reference voltage.

The comparator 642 of the calibration control circuit 640 may determine whether the level of the power voltage VDDQ is a high level or a low level by comparing the level of the reference voltage $V_{REF}$ with the level of the power voltage VDDQ, and may provide the comparison signal COMP to a counter 641. For example, when the comparator 642 determines that the level of the power voltage VDDQ is lower than the level of the reference voltage $V_{REF}$, the comparator 642 may provide the comparison signal COMP of a logic high level to the counter 641. The reference voltage $V_{REF}$ may have a level fixed to a certain level. However, embodiments of the present inventive concept are not limited thereto. The reference voltage $V_{REF}$ may have a level changeable according to the host device and/or a user request.

The counter 641 according to an embodiment may generate a counting output signal CT_OUT according to the calibration start enable signal ZQ_Start_EN and the comparison signal COMP. The calibration start enable signal ZQ_Start_EN received from the memory controller or the host device may be a signal associated with a command for the ZQ calibration operation and may be an enable signal that activates the counter 641.

The counter 641 may generate the counting output signal CT_OUT when the calibration start enable signal ZQ_Start_EN and the comparison signal COMP, which are in certain logic states for a certain period of time, are received. The comparison signal COMP having a certain logic state may be in a logic-high state. However, embodiments of the present inventive concept are not limited thereto. For example, in an embodiment, the counter 641 may increase a counting number by one when the calibration start enable signal ZQ_Start_EN and the comparison signal COMP of certain logic states are received, and when the counting number is equal to or greater than a reference counting number, the counter 641 may output the counting output signal CT_OUT of a logic low level.

When the counting output signal CT_OUT and the calibration start enable signal ZQ_Start_EN are at a logic high level, the calibration control circuit 640 according to an embodiment may determine that the calibration command signal ZQ_CTR is a logic high level signal. When any one of the counting output signal CT_OUT and the calibration start enable signal ZQ_Start_EN is a logic low signal, the calibration control circuit 640 may output the calibration command signal ZQ_CTR of a logic low level.

That is, when the calibration start signal ZQ_Start_CMD and the calibration enable signal ZQ_EN are not input to the memory device as the memory controller or the host device determines not to perform the ZQ calibration operation, the calibration control circuit 640 may block the generation of the calibration command signal ZQ_CTR. In addition, even though the execution of the ZQ calibration operation should be prevented as a low power voltage is applied to the calibration circuit, when the calibration command CMD_ZQ controlling the execution of the ZQ calibration operation is received from the memory controller or the host device, the comparator 642 determines that the power voltage VDDQ is lower than the reference voltage $V_{REF}$. As a result, the calibration control circuit 640 may output the calibration command signal ZQ_CTR of a logic low level, and thus, may deactivate the ZQ calibration operation.

Components included in the calibration control circuit 640 such as, for example, the counter 641 and the AND gate that outputs the calibration command signal ZQ_CTR to the calibration circuit 630, may be referred to separately or collectively as a command signal output unit (or a command signal output circuit).

FIG. 7 is a timing diagram of signals that are input to the calibration control circuit of FIG. 6.

Referring to FIG. 7, as shown in the timing diagram of FIG. 5B, the power voltage VDDQ may have multiple levels, but the memory device may violate the JEDEC Specification and perform the ZQ calibration operation as a logic high level of the calibration start signal ZQ_Start and the calibration enable signal ZQ_EN are input.

The calibration control circuit according to an embodiment may output the calibration command signal ZQ_CTR of a logic high level because the high power voltage level VDDQ_HIGH, which is higher than the level of the reference voltage $V_{REF}$, is applied in a first section T1. Accordingly, in the first section T1, the calibration circuit may perform the ZQ calibration operation.

Then, in a second section T2, in an ideal situation in which the level of the power voltage VDDQ is dropped to a low level, the calibration start signal ZQ_Start or the calibration enable signal ZQ_EN should transition to a logic low level, but a logic-high state may be maintained as in the first section T1.

In the second section T2, the comparator may compare the level of the power voltage VDDQ with the level of the reference voltage $V_{REF}$, and when it is determined that the level of the power voltage VDDQ is lower than the level of the reference voltage $V_{REF}$, the comparator may output the comparison signal COMP of a high logic level. The counter may start a counting operation by receiving the comparison signal COMP of a high logic level and the calibration start enable signal ZQ_Start_EN of a high logic level. The counter may compare the counting number with the reference counting number by increasing the counting number by one whenever a counting pulse CP is generated. For example, when the reference counting number is three, the calibration control circuit may output the calibration command signal ZQ_CTR of a high logic level until the counter performs counting two times in a row. That is, when the level of the power voltage VDDQ is lower than that of the reference voltage $V_{REF}$, the calibration control circuit according to an embodiment does not immediately stop the ZQ calibration operation, but may determine a state of the power voltage VDDQ until a certain period of time passes after the power voltage VDDQ is applied at the low power voltage level VDDQ_LOW. Then, the calibration control circuit may determine whether to block the ZQ calibration operation. Therefore, the memory device according to an embodiment may prevent the ZQ calibration operation from being blocked even though the ZQ calibration operation may be performed because of an instantaneous drop of the power voltage VDDQ.

According to an embodiment of FIG. 7, the second section T2 is a section in which the counting pulses CP are generated three times. The reference counting number is three. However, embodiments of the present inventive concept are not limited thereto. In addition, the memory device may adjust the reference counting number according to a request of the memory controller or the host device. For example, the memory device may measure an amount of consumed power according to the ZQ calibration operation and may adjust the reference counting number based on the amount of consumed power. When an amount of consumed power is greater than a reference power amount, the memory controller or the host device may determine that an unnecessary ZQ calibration operation is to be stopped quickly, and by reducing the reference counting number to be less than a previous reference counting number, the memory device may quickly block the execution of the ZQ calibration operation. That is, the memory device may output the calibration command signal ZQ_CTR of a low logic level when the power voltage VDDQ is lower than the reference voltage $V_{REF}$ in a number that is equal to or greater than a certain consecutive reference number of times. The memory device may adjust the reference counting number according to an amount of power consumed during the ZQ calibration operation.

In a third section T3, as the counting pulses CP are continuously generated for more than the reference counting number, the counter may generate the counting output signal CT_OUT of low logic level. When the counting output signal CT_OUT of a low logic level is generated, the counting output signal CT_OUT and the calibration start enable signal ZQ_Start_EN may be input to the AND gate, and the calibration command signal ZQ_CTR of a low logic level may be output.

When the power voltage VDDQ becomes higher than the reference voltage $V_{REF}$ as the low power voltage level VDDQ_LOW increases to the high power voltage level VDDQ_HIGH, the memory device may enter a fourth section T4. In the fourth section T4, the comparator may output the comparison signal COMP of a low logic level, and the counter may stop generating the counting pulses CP. Accordingly, the memory device may generate the calibration command signal ZQ_CTR of a high logic level, and thus, the calibration circuit may resume the ZQ calibration operation.

A calibration control circuit 840 of the memory device according to an embodiment of FIG. 8 may output the calibration start enable signal ZQ_Start_EN according to a background calibration start signal ZQ_Start_BG and the calibration enable signal ZQ_EN. The timer may determine whether to output the background calibration start signal ZQ_Start_BG by receiving the calibration start enable signal ZQ_Start_EN. Some aspects of a calibration circuit 830, the calibration control circuit 840, and a command decoder 850 illustrated in FIG. 8 may be the same as or similar to some aspects of the calibration circuit 230, the calibration control circuit 240, and the command decoder 250 previously described with reference to FIGS. 1 and 2, respectively. For convenience of explanation, a further description of such aspects may be omitted.

When the background calibration start signal ZQ_Start_BG and the calibration enable signal ZQ_EN are logic high signals, the calibration start enable signal ZQ_Start_EN of a logic high level may be output through the AND gate included in the calibration control circuit 840. The comparator 842 may generate the comparison signal COMP by comparing the power voltage VDDQ with the reference voltage $V_{REF}$. The counter 841 may generate a counting output signal CT_OUT according to the calibration start enable signal ZQ_Start_EN and the comparison signal COMP. The generation of the counting output signal CT_OUT by the counter 841 is described with reference to FIG. 6, and thus, for convenience of explanation, a further detailed description thereof will be omitted. The calibration control circuit 840 may output the calibration command signal ZQ_CTR of a low logic level when any one of the calibration start enable signal ZQ_Start_EN and the counting output signal CT_OUT is a logic low signal.

That is, when the background calibration start signal ZQ_Start_BG and the calibration enable signal ZQ_EN are not input to the memory device as the memory controller or the host device determines not to perform the ZQ calibration operation, the calibration control circuit 840 may block the generation of the calibration command signal ZQ_CTR. In addition, even though the execution of the ZQ calibration operation is to be prevented as a low power voltage is applied to the calibration circuit, when the calibration command CMD_ZQ controlling the execution of the ZQ calibration operation is received from the memory controller or the host device, the comparator 842 determines that the power voltage VDDQ is lower than the reference voltage $V_{REF}$. The calibration control circuit 840 may output the calibration command signal ZQ_CTR of a low logic level, and thus, may deactivate the ZQ calibration operation.

Figure 9:
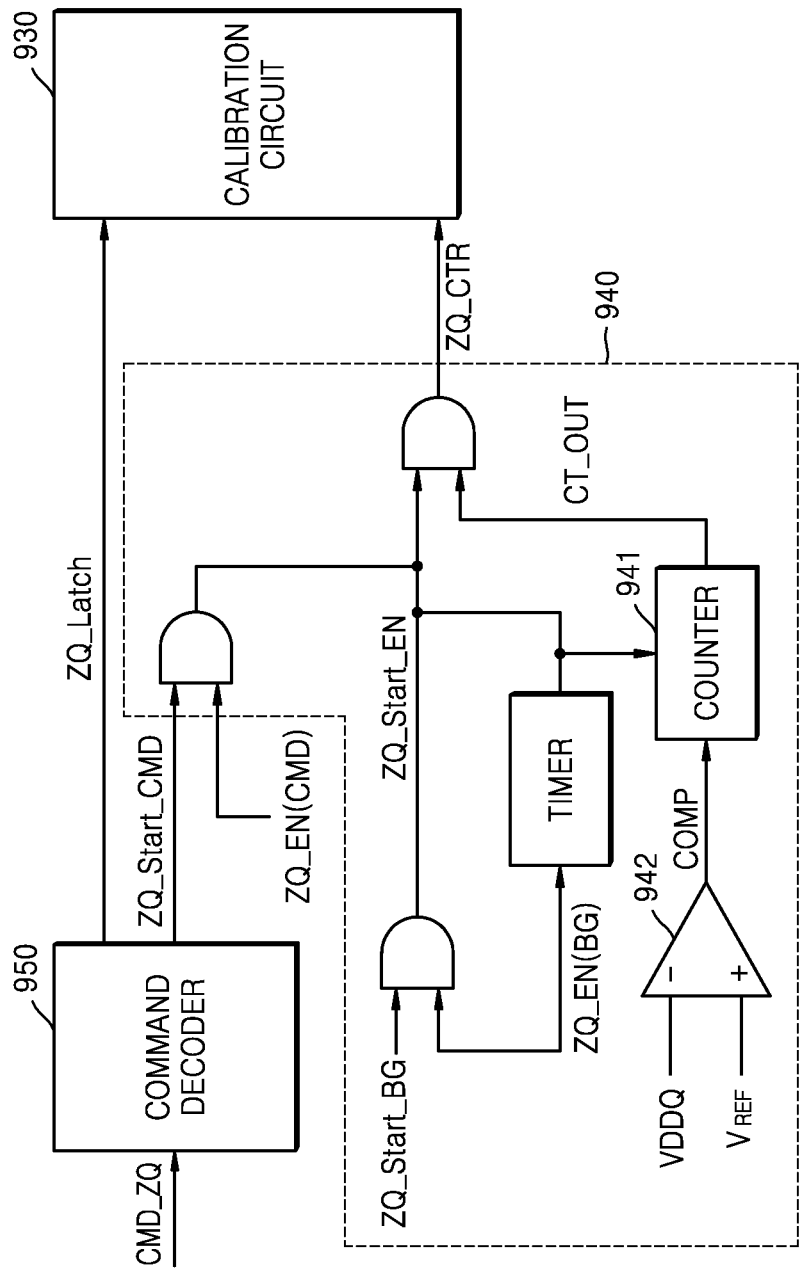

A memory device of FIG. 9 may include a calibration control circuit 940 in which part of the calibration control circuit 640 of FIG. 6 is connected to part of the calibration control circuit 840 of FIG. 8. That is, when the calibration start signal ZQ_Start_CMD is received from a command decoder 950, or when the calibration start signal ZQ_Start_BG is received through a feedback circuit via which the calibration start enable signal ZQ_Start_EN is fed back, the memory device of FIG. 9 may output the calibration command signal ZQ_CTR. Some aspects of a calibration circuit 930, the calibration control circuit 940, and a command decoder 950 illustrated in FIG. 9 may be the same as or similar to some aspects of the calibration circuit 230, the calibration control circuit 240, and the command decoder 250 previously described with reference to FIGS. 1 and 2, respectively. For convenience of explanation, a further description of such aspects may be omitted.

When the calibration enable signal ZQ_EN is input from the memory controller or the host device, the memory device may receive a command enable signal ZQ_EN(CMD) or a background enable signal ZQ_EN(BG). The command enable signal ZQ_EN(CMD) is a signal used to activate the execution of the ZQ calibration operation according to a command from the memory controller or the host device, and the background enable signal ZQ_EN(BG) may be a signal used to activate the execution of the ZQ calibration operation due to internal feedback of the memory device. That is, when the memory controller or the host device determines that the ZQ calibration operation is necessary, the calibration enable signal ZQ_EN of any one of the background enable signal ZQ_EN(BG) and the command enable signal ZQ_EN(CMD) may be provided to the memory device.

According to an embodiment, the background enable signal ZQ_EN(BG) and the command enable signal ZQ_EN(CMD) are not simultaneously applied to the memory device, and when the memory controller or the host device determines to perform the ZQ calibration operation by directly transmitting a command, only the command enable signal ZQ_EN(CMD) may be transmitted to the memory device. On the contrary, when the memory controller or the host device determines to perform the ZQ calibration operation inside the memory device, the background enable signal ZQ_EN(BG) may only be provided to the memory device. When the memory controller or the host device determines that the execution of the ZQ calibration operation is unnecessary, both the command enable signal ZQ_EN(CMD) and the background enable signal ZQ_EN(BG) are not be provided to the memory device in an embodiment.

A comparator 942 may generate the comparison signal COMP by comparing the power voltage VDDQ with the reference voltage $V_{REF}$, and a counter 941 may generate the counting output signal CT_OUT according to the calibration start enable signal ZQ_Start_EN and the comparison signal COMP. The calibration control circuit 940 may determine that the calibration command signal ZQ_CTR is a logic high signal when the counting output signal CT_OUT and the calibration start enable signal ZQ_Start_EN are at a high logic level. When any one of the counting output signal CT_OUT and the calibration start enable signal ZQ_Start_EN is a logic low signal, the calibration command signal ZQ_CTR of a low logic level may be output.

That is, when the calibration start signal ZQ_Start and the calibration enable signal ZQ_EN are not input to the memory device because the memory controller or the host device determines not to perform the ZQ calibration operation, the calibration control circuit 940 may block the generation of the calibration command signal ZQ_CTR. In addition, when the calibration command CMD_ZQ controlling the execution of the ZQ calibration operation is received from the memory controller or the host device even though the execution of the ZQ calibration operation is to be prevented as a low power voltage is applied to the calibration circuit, and when the comparator 942 determines that the power voltage VDDQ is lower than the reference voltage $V_{REF}$, the calibration control circuit 940 may output the calibration command signal ZQ_CTR of low logic level, and thus, may deactivate the ZQ calibration operation.

Figure 10:
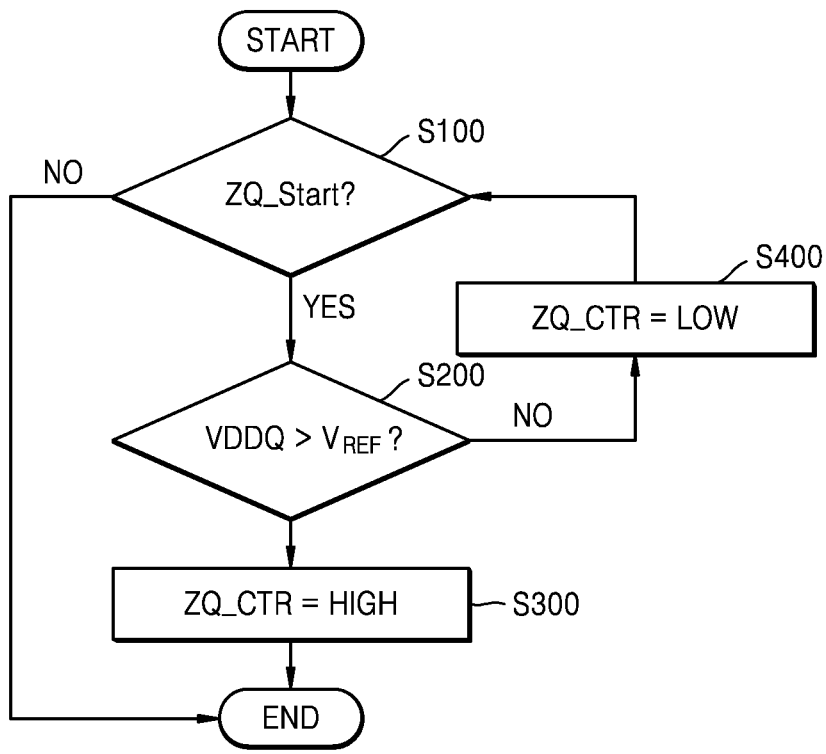
FIG. 10 is a flowchart of operations of an operation method of a memory device.

FIG. 10 is a flowchart of operations of an operation method of the memory device according to an embodiment.

In operation S100, the memory device according to an embodiment may determine whether the calibration start signal ZQ_Start is transmitted. The calibration start signal ZQ_Start may be a signal included in a command received from the memory controller or the host device or may be a background signal that is periodically generated in an internal feedback circuit. When the calibration start signal ZQ_Start is transmitted, the memory device may perform operation S200, and when the calibration command signal ZQ_CTR is not transmitted, the memory device may end the ZQ calibration operation.

In operation S200, the memory device according to an embodiment may compare the power voltage VDDQ with the reference voltage $V_{REF}$. When the power voltage VDDQ is higher than the reference voltage $V_{REF}$, the memory device may determine that the power voltage VDDQ has the high power voltage level VDDQ_HIGH, and when the power voltage VDDQ is lower than the reference voltage $V_{REF}$, the memory device may determine that the power voltage VDDQ has the low power voltage level VDDQ_LOW.

In operation S300, when the memory device determines that the power voltage VDDQ has the high power voltage level VDDQ_HIGH, the memory device may output the calibration command signal ZQ_CTR of a high logic level. When the calibration command signal ZQ_CTR of a high logic level is input to the calibration circuit, the calibration circuit may perform the ZQ calibration operation.

In operation S400, when the memory device determines that the power voltage VDDQ has the low power voltage level VDDQ_LOW, the memory device may output the calibration command signal ZQ_CTR of a low logic level. When the calibration command signal ZQ_CTR of a low logic level is input to the calibration circuit, the calibration circuit does not perform the ZQ calibration operation and may determine, in operation S100, whether the calibration start signal ZQ_Start is input to the memory device again, thus repeating the above-described operations.

Figure 11:
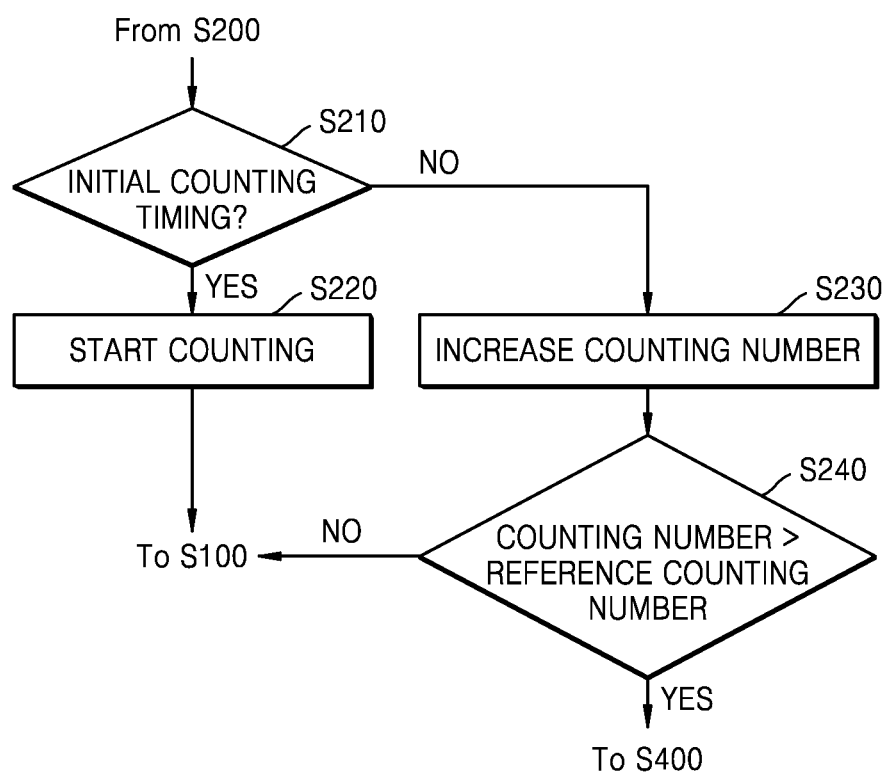
FIG. 11 is a flowchart of operations of an operation method according to examples of the calibration control circuit including the counter of FIGS. 6 to 9.

FIG. 11 is a flowchart of operations of an operation method according to embodiments of the calibration control circuit including the counter of FIGS. 6 to 9.

According to an embodiment, when determining that the power voltage is lower than the reference voltage $V_{REF}$, the memory device may increase the counting number by one in every counting timing. In operation S210, when determining that the power voltage VDDQ is lower than the reference voltage $V_{REF}$, the memory device may determine whether the counting number, which is temporarily stored in the counter, is 0 or equal to or greater than 1. When the stored counting number is 0, the counter may determine, as an initial counting timing, a counting timing corresponding to the generated counting pulses. When the counting timing corresponding to the generated counting pulse is determined as the initial counting timing, the memory device may proceed to operation S220, and when the counting timing is not determined as the initial counting timing, the memory device may proceed to operation S230.

In operation S220, the memory device may start storing the counting number at least temporarily, and thus, may start the counting operation. In operation S230, the memory device may increase the counting number by one based on the counting pulses generated corresponding to the counting timing.

In operation S240, the memory device may determine whether the accumulated counting number of the counter is greater than the reference counting number. The reference counting number may be set in advance. However, embodiments of the present inventive concept are not limited thereto. The reference counting number may be adjustable according to an amount of consumed power. When the accumulated counting number is greater than the reference counting number, the memory device may generate the calibration command signal ZQ_CTR of a low logic level by proceeding to operation S400, and when the accumulated counting number is less than the reference counting number, the memory device may proceed to operation S100.

Figure 12:
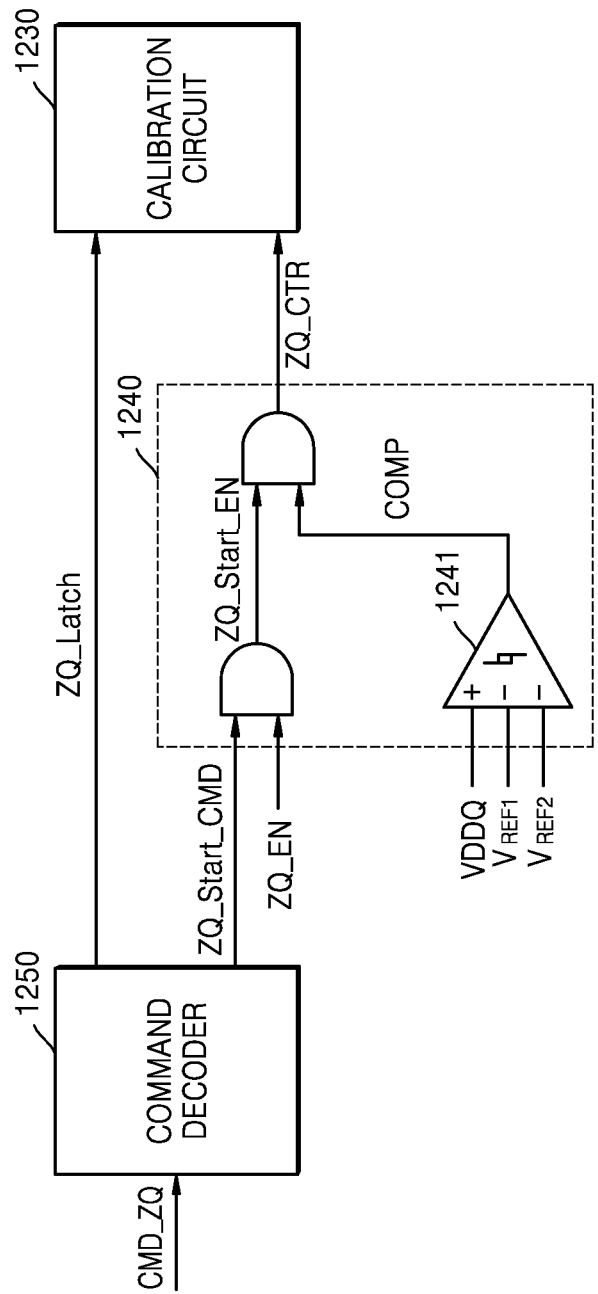
FIG. 12 shows an example of a calibration control circuit including a hysteresis comparator.
Figure 13:
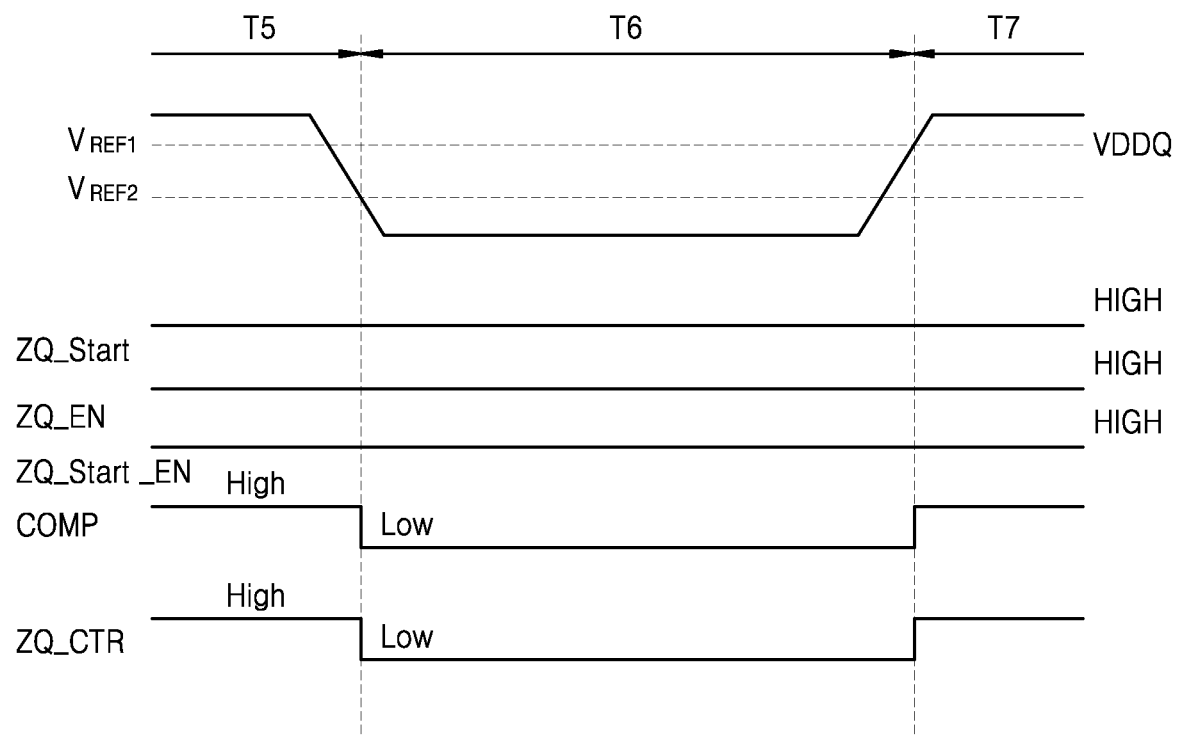
FIG. 13 is a timing diagram of signals that are input to the calibration control circuit of FIG. 12.
Figure 14:
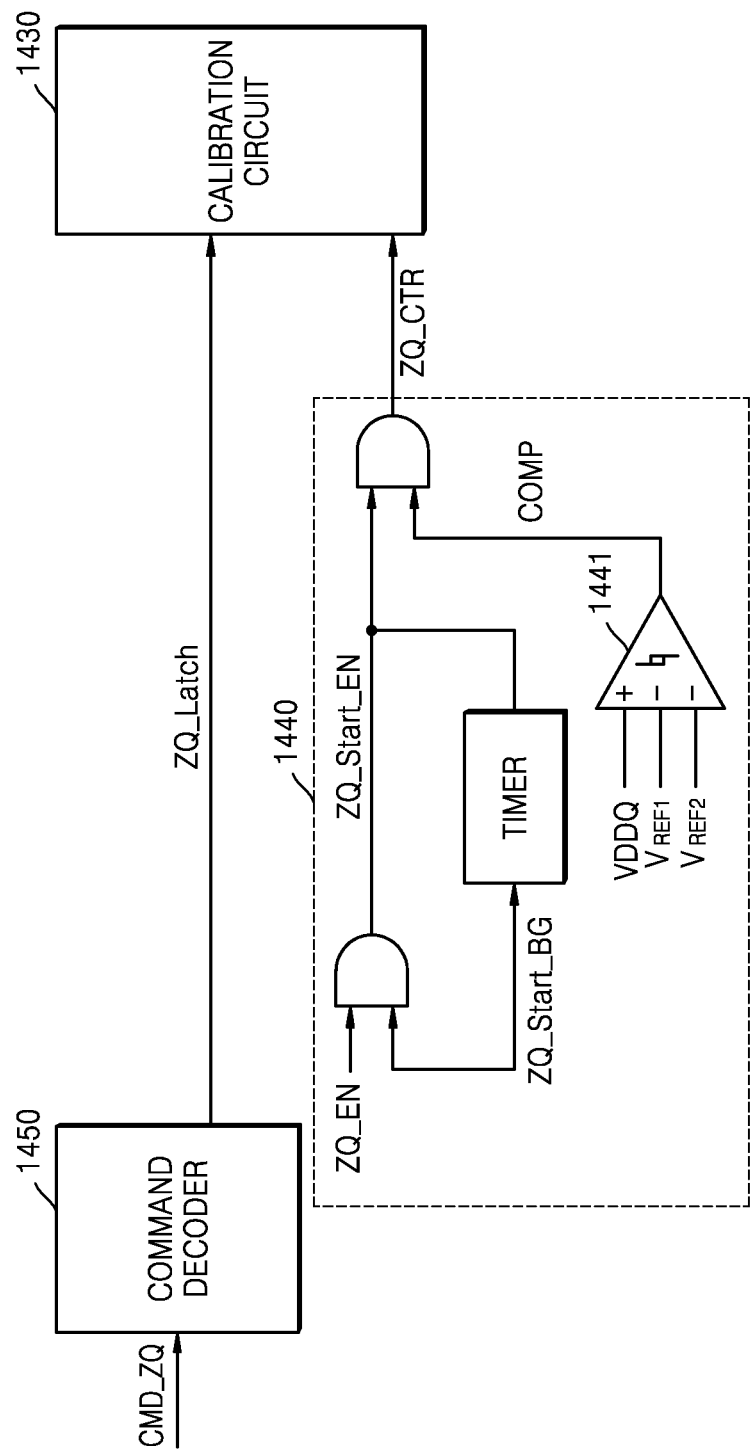
FIGS. 14 and 15 show examples of a calibration control circuit including a hysteresis comparator.

FIGS. 12 to 14 show embodiments of a calibration control circuit including a hysteresis comparator 1241.

A calibration control circuit 1240 of the memory device according to an embodiment of FIG. 12 may output the calibration start enable signal ZQ_Start_EN in response to the calibration start signal ZQ_Start_CMD and the calibration enable signal ZQ_EN. The calibration control circuit 1240 may determine a logic state of the calibration start enable signal ZQ_Start_EN in response to the calibration start signal ZQ_Start_CMD and the calibration enable signal ZQ_EN. For example, when the calibration start signal ZQ_Start_CMD and the calibration enable signal ZQ_EN are logic high signals, the calibration control circuit 1240 may output the calibration start enable signal ZQ_Start_EN of a high logic level through the AND gate. Some aspects of a calibration circuit 1230, the calibration control circuit 1240, and a command decoder 1250 illustrated in FIG. 12 may be the same as or similar to some aspects of the calibration circuit 230, the calibration control circuit 240, and the command decoder 250 previously described with reference to FIGS. 1 and 2, respectively. For convenience of explanation, a further description of such aspects may be omitted.

The memory device according to an embodiment may classify levels of the power voltage VDDQ into a high level and a low level, based on a hysteresis comparator 1241 operating in a hysteresis mode. The hysteresis comparator 1241 may be referred to as a Schmitt trigger. In the hysteresis mode, at least two reference voltages are compared with the power voltage VDDQ. When the power voltage VDDQ is equal to or higher than a first reference voltage $V_{REF1}$, the power voltage VDDQ may have a high level, and when the power voltage VDDQ is equal to or lower than a second reference voltage $V_{REF2}$, the power voltage VDDQ may have a low level. In this case, the level of the first reference voltage $V_{REF1}$ may be greater than the level of the second reference voltage $V_{REF2}$.

When the hysteresis comparator 1241 operates in the hysteresis mode, the comparator 1241 may determine whether the power voltage VDDQ, which has a voltage between the first reference voltage $V_{REF1}$ and the second reference voltage $V_{REF2}$, has a high logic level or a low logic level based on a previous logic level of the power voltage VDDQ. For example, when the power voltage VDDQ input to the hysteresis comparator 1241 has a lower level than the first reference voltage $V_{REF1}$, and when the previous level of the power voltage VDDQ is greater than the level of the first reference voltage $V_{REF1}$, the comparator 1241 may determine that the power voltage VDDQ has the high power voltage level VDDQ_HIGH. On the contrary, when the power voltage VDDQ input to the comparator 1241 has a lower level than the first reference voltage $V_{REF1}$, or when the previous level of the power voltage VDDQ is lower than that of the first reference voltage $V_{REF1}$, the comparator 1241 may determine that the power voltage VDDQ has the low power voltage level VDDQ_LOW.

That is, the comparator 1241 may determine which one of the first reference voltage $V_{REF1}$ and the second reference voltage $V_{REF2}$ is to be compared with the power voltage VDDQ, according to a previous logic state of the calibration command signal ZQ_CTR. When the previous logic state of the calibration command signal ZQ_CTR is a logic high level, the comparator 1241 may compare the first reference voltage $V_{REF1}$ with the power voltage VDDQ, and when the previous logic state of the calibration command signal ZQ_CTR is a logic low level, the hysteresis comparator 1241 may compare the second reference voltage $V_{VREF2}$ with the power voltage VDDQ.

When it is determined that the power voltage VDDQ has the high power voltage level VDDQ_HIGH, the comparator 1241 according to an embodiment may output the comparison signal COMP of a high logic level, and when it is determined that the power voltage VDDQ has a low level, the comparator 1241 may output the comparison signal COMP of a low logic level.

The calibration control circuit 1240 of the memory device may provide the calibration command signal ZQ_CTR to the calibration circuit 1230 according to the calibration start enable signal ZQ_Start_EN and the comparison signal COMP. When the calibration start enable signal ZQ_Start_EN and the comparison signal COMP are logic high signals, it may be determined that the calibration command signal ZQ_CTR is of logic high, and when any one of the calibration start enable signal ZQ_Start_EN and the comparison signal COMP is a logic low signal, the calibration control circuit 1240 may output the calibration command signal ZQ_CTR of logic low.

That is, when the calibration start signal ZQ_Start_CMD and the calibration enable signal ZQ_EN are not input to the memory device as the memory controller or the host device determines not to perform the ZQ calibration operation, the calibration control circuit 1240 may block the generation of the calibration command signal. In addition, when the comparator 1241 determines that the power voltage VDDQ has the low logic level, the calibration control circuit 1240 may deactivate the ZQ calibration operation by outputting the calibration command signal ZQ_CTR of a low logic level.

FIG. 13 is a timing diagram of signals that are input to the calibration control circuit of FIG. 12.

In a fifth section T5, the calibration control circuit according to an embodiment may output the calibration command of a high logic level as the high power voltage level VDDQ_HIGH, which is greater than the second reference voltage $V_{REF2}$. At a point of the fifth section T5, where the power voltage VDDQ becomes equal to the first reference voltage $V_{REF1}$, the memory device may determine the previous level of the power voltage VDDQ, and referring to FIG. 13, because the previous level of the power voltage VDDQ is a high logic level, the calibration control circuit may continue to determine that the power voltage VDDQ has a high logic level. Accordingly, although the power voltage VDDQ is between the first reference voltage $V_{REF1}$ and the second reference voltage $V_{REF2}$, the calibration control circuit may output the calibration command signal ZQ_CTR of a high logic level.

Then, in a sixth section T6, as the level of the power voltage VDDQ is dropped to a low logic level, the logic state of the calibration start signal ZQ_Start or the calibration enable signal ZQ_EN should be transitioned to low logic level in an ideal situation, but the logic-high state may be maintained as in the fifth section T5.

In the sixth section T6, the calibration control circuit may determine the power voltage VDDQ has a low level because the level of the voltage VDDQ becomes lower than that of the second reference voltage $V_{REF2}$, and thus, the calibration control circuit may output the comparison signal COMP of a low logic level. The calibration control circuit may compare the logic state of the calibration start enable signal ZQ_Start_EN with the logic state of the comparison signal COMP through, for example, the AND gate, and because the comparison signal COMP is a logic low signal, the calibration control circuit may output the calibration command signal ZQ_CTR of a low logic level.

At a point of the sixth section T6, where the second reference voltage $V_{REF2}$ becomes equal to the power voltage VDDQ, the memory device may determine a previous level of the power voltage VDDQ, and referring to FIG. 13, because the previous level of the power voltage VDDQ is a low logic level, the calibration control circuit may continue to determine that the power voltage VDDQ has the low logic level. Accordingly, although the power voltage VDDQ is between the first reference voltage $V_{REF1}$ and the second reference voltage $V_{REF2}$, the calibration control circuit may keep outputting the calibration command signal ZQ_CTR of the low logic level.

That is, the calibration control circuit may determine a reference voltage between the first reference voltage $V_{REF1}$ and the second reference voltage $V_{REF2}$, which is compared with the power voltage VDDQ, according to the logic state of the calibration command signal ZQ_CTR. In the fifth section T5, the calibration control circuit may compare the power voltage VDDQ with the second reference voltage $V_{REF2}$ because the calibration command signal ZQ_CTR is a logic high signal, and in the sixth section T6, the calibration control circuit may compare the power voltage VDDQ with the first reference voltage $V_{REF1}$ because the calibration command signal ZQ_CTR is a logic low signal.

In a seventh section T7, the calibration control circuit may determine that the power voltage VDDQ has a high logic level because the power voltage VDDQ becomes higher than the first reference voltage $V_{REF1}$, and may output the comparison signal COMP of a high logic level. The calibration control circuit may compare the logic states of the calibration start enable signal ZQ_Start_EN and the comparison signal COMP by using, for example, the AND gate, and because the logic states of the calibration start enable signal ZQ_Start_EN and the comparison signal COMP are a high logic level, the calibration control circuit may output the calibration command signal ZQ_CTR of a high logic level. Accordingly, the calibration control circuit may resume the ZQ calibration operation by providing the calibration command signal ZQ_CTR of a high logic level to the calibration circuit.

Figure 15:
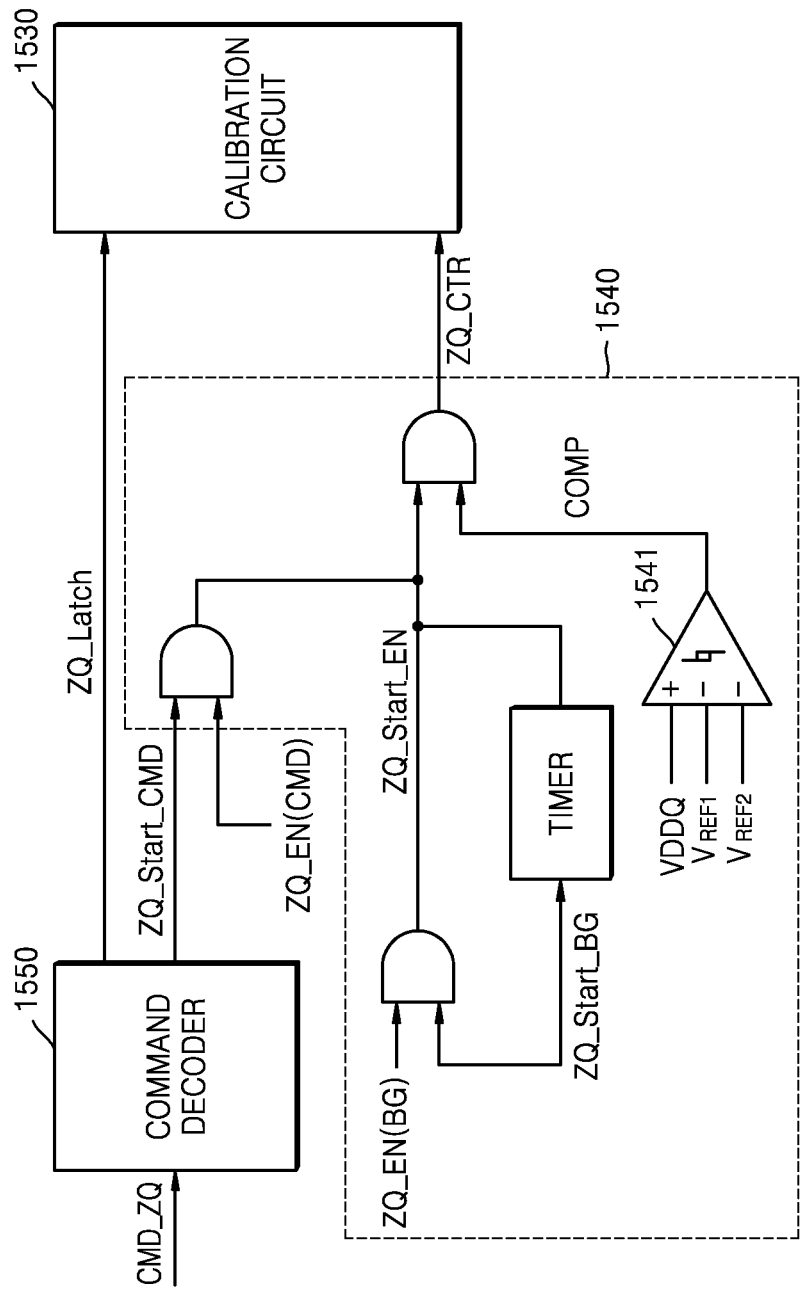

FIGS. 14 and 15 show examples of a calibration control circuit including a hysteresis comparator.

A calibration control circuit 1440 of the memory device according to an embodiment of FIG. 14 may output the calibration start enable signal ZQ_Start_EN according to the calibration start signal ZQ_Start_BG and the calibration enable signal ZQ_EN. A comparator 1441 may determine whether the power voltage VDDQ has a high logic level or a low logic level. The comparator 1441 may be a hysteresis comparator 1441 operating in the hysteresis mode. The hysteresis comparator 1441 may output the comparison signal COMP by determining whether the power voltage VDDQ has a low logic level or a high logic level. The output of the comparison signal COMP is described with reference to FIG. 12, and thus, for convenience of explanation, a further detailed description thereof will be omitted. Some aspects of a calibration circuit 1430, the calibration control circuit 1440, and a command decoder 1450 illustrated in FIG. 14 may be the same as or similar to some aspects of the calibration circuit 230, the calibration control circuit 240, and the command decoder 250 previously described with reference to FIGS. 1 and 2, respectively. For convenience of explanation, a further description of such aspects may be omitted.

The calibration control circuit 1440 may determine that the calibration command signal ZQ_CTR is a logic high signal when the calibration start enable signal ZQ_Start_EN and the comparison signal COMP are logic high signals, and when any one of the calibration start enable signal ZQ_Start_EN and the comparison signal COMP is a logic low signal, the calibration control circuit 1440 may output the calibration command signal ZQ_CTR of a low logic level.

That is, when the background calibration start signal ZQ_Start_BG and the calibration enable signal ZQ_EN are not input to the memory device because the memory controller or the host device determines not to perform the ZQ calibration operation, the calibration control circuit 1440 may block the generation of the calibration command signal ZQ_CTR. In addition, when the hysteresis comparator 1441 determines that the power voltage VDDQ has a low level, the calibration control circuit 1440 may deactivate the ZQ calibration operation by outputting the calibration command signal ZQ_CTR of a low logic level.

A memory device of FIG. 15 may include a calibration control circuit 1540 in which part of the calibration control circuit 1240 of FIG. 12 is connected to part of the calibration control circuit 1440 of FIG. 14. That is, when the memory device of FIG. 15 receives the calibration start signal ZQ_Start_CMD from a command decoder 1550 or the background calibration start signal ZQ_Start_BG through a feedback circuit via which the calibration start enable signal ZQ_Start_EN is received, the memory device may output the calibration command signal ZQ_CTR.

When the memory controller or the host device determines that the ZQ calibration operation is to be performed, the calibration enable signal ZQ_EN of any one of the background enable signal ZQ_EN(BG) and the command enable signal ZQ_EN(CMD) may be provided to the memory device. The background enable signal ZQ_EN(BG) and the command enable signal ZQ_EN(CMD) may not be simultaneously applied to the memory device, and when the execution of the ZQ calibration operation is determined as the memory controller or the host device directly transmits a command to the memory device, only the command enable signal ZQ_EN(CMD) may be provided to the memory device. Some aspects of a calibration circuit 1530, the calibration control circuit 1540, and the command decoder 1550 illustrated in FIG. 15 may be the same as or similar to some aspects of the calibration circuit 230, the calibration control circuit 240, and the command decoder 250 previously described with reference to FIGS. 1 and 2, respectively. For convenience of explanation, a further description of such aspects may be omitted.

The calibration control circuit 1540 may generate the calibration start enable signal ZQ_Start_EN by receiving the calibration start signal ZQ_Start and the calibration enable signal ZQ_EN. The hysteresis comparator 1541 may generate the comparison signal COMP based on the comparator 1541 operating in the hysteresis mode. The generation of the calibration start enable signal ZQ_Start_EN and the comparison signal COMP is described with reference to FIGS. 12 and 13, and for convenience of explanation, a further detailed description thereof will be omitted.

The calibration control circuit 1540 may determine that the calibration command signal ZQ_CTR is a logic high signal when the calibration start enable signal ZQ_Start_EN and the comparison signal COMP are logic high signals, and when any one of the calibration start enable signal ZQ_Start_EN and the comparison signal COMP is a logic low signal, the calibration control circuit 1540 may output the calibration command signal ZQ_CTR of a low logic level.

That is, when the calibration start signal ZQ_Start and the calibration enable signal ZQ_EN are not input to the memory device because the memory controller or the host device determines not to perform the ZQ calibration operation, the calibration control circuit 1540 may block the generation of the calibration command signal. In addition, when the comparator 1541 determines that the power voltage VDDQ has a low logic level, the calibration control circuit 1540 may deactivate the ZQ calibration operation by outputting the calibration command signal ZQ_CTR of a low logic level.

According to the embodiments of FIGS. 12 and 15, when the power voltage VDDQ has a value between a first comparison voltage and a second comparison voltage, the calibration control circuit may maintain a previous voltage level in some cases. Accordingly, the calibration control circuit may prevent unwanted switching of a logic state of the calibration command signal ZQ_CTR that may be caused due to noise in the power voltage VDDQ. For example, referring to FIG. 13, when the power voltage VDDQ has a high logic level, the power voltage VDDQ may be dropped to be lower than or equal to the first reference voltage $V_{REF1}$ because of noise, and the comparator operating in the hysteresis mode may maintain the logic state of the calibration command signal ZQ_CTR as a logic-high state unless the power voltage VDDQ is dropped to be lower than or equal to the second reference voltage $V_{REF2}$.

Figure 16:
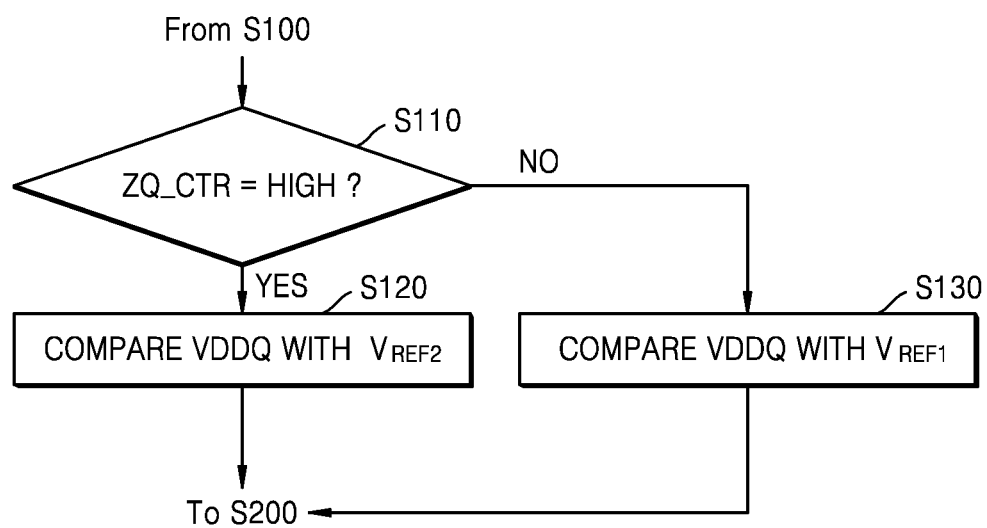
FIG. 16 is a flowchart of operations of an operation method according to examples of a calibration control circuit including the hysteresis comparator of FIGS. 12 to 15.

FIG. 16 is a flowchart of operations of an operation method according to examples of a calibration control circuit including the hysteresis comparator of FIGS. 12 to 15.

In operation S110, when the calibration start signal ZQ_Start is received, the calibration control circuit may determine a current logic state of the calibration command signal ZQ_CTR. When the logic state of the calibration command signal ZQ_CTR is a high logic level, the calibration control circuit may proceed to operation S120. When the logic state of the calibration command signal ZQ_CTR is a low logic level, the calibration control circuit may proceed to operation S130.

In operation S120, when it is determined that the current logic state of the calibration command signal ZQ_CTR is a high logic level, the calibration control circuit may set a comparison voltage, which is compared with the power voltage VDDQ, as the second reference voltage $V_{REF2}$. In operation S130, when it is determined that the current logic state of the calibration command signal ZQ_CTR is a low logic level, the calibration control circuit may set a comparison voltage, which is compared with the power voltage VDDQ, as the first reference voltage $V_{REF1}$. Therefore, when the logic state of the calibration command signal ZQ_CTR is a high logic level, the calibration control circuit may continue to output the calibration command signal ZQ_CTR of a high logic level regardless of a result of comparing the power voltage VDDQ with the first reference voltage $V_{REF1}$. When the logic state of the calibration command signal ZQ_CTR is a low logic level, the calibration control circuit may continue to output the calibration command signal ZQ_CTR of a low logic level regardless of a result of comparing the power voltage VDDQ with the second reference voltage $V_{REF2}$.

Figure 17:
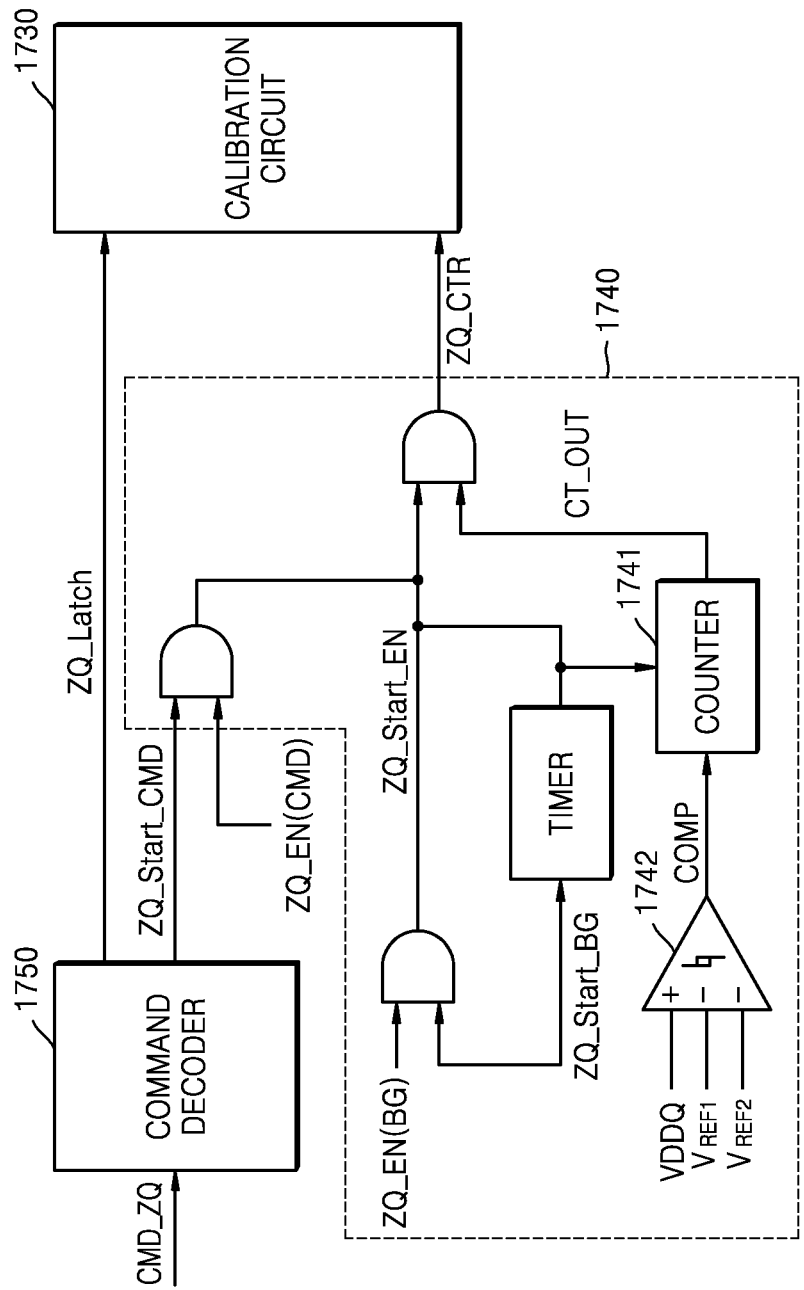
FIG. 17 shows an example of a calibration control circuit including a counter and a hysteresis comparator.
Figure 18:
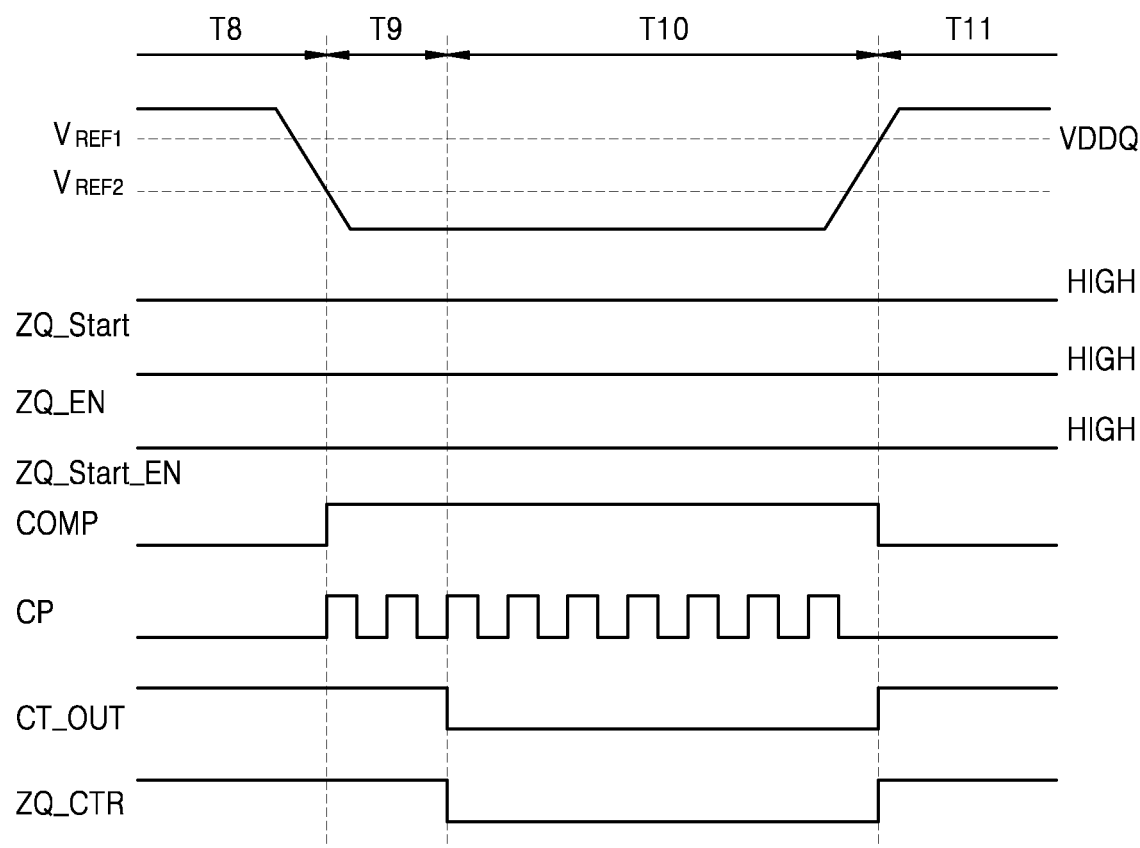
FIG. 18 is a timing diagram of signals that are input to the calibration control circuit of FIG. 17.

FIG. 17 shows an example of a calibration control circuit including a counter and a hysteresis comparator. FIG. 18 is a timing diagram of signals that are input to the calibration control circuit of FIG. 17.

A calibration control circuit 1740 of FIG. 17 may include a hysteresis comparator 1742 operating in the hysteresis mode instead of the comparator 842 of the calibration control circuit illustrated in FIG. 8. A comparison signal COMP output from the comparator 1742 may be generated as the power voltage VDDQ is compared with one of the first reference voltage $V_{REF1}$ and the second reference voltage $V_{REF2}$, according to the logic state of the calibration command signal ZQ_CTR. Some aspects of a calibration circuit 1730, the calibration control circuit 1740, and a command decoder 1750 illustrated in FIG. 17 may be the same as or similar to some aspects of the calibration circuit 230, the calibration control circuit 240, and the command decoder 250 previously described with reference to FIGS. 1 and 2, respectively. For convenience of explanation, a further description of such aspects may be omitted.

In an eighth section T8, the logic state of the calibration command signal ZQ_CTR is a high logic level, and the calibration control circuit 1740 may compare the power voltage VDDQ with the second reference voltage $V_{REF2}$ and may generate the comparison signal COMP. In this case, the hysteresis comparator 1742 may provide the comparison signal COMP of a low logic level to a counter 1741. The counter 1741 may output the counting output signal CT_OUT of a high logic level instead of performing a counting operation, and thus, may provide the calibration command signal ZQ_CTR of a high logic level to the calibration circuit 1730.

In a ninth section T9, because the power voltage VDDQ is dropped to be lower than or equal to the second reference voltage $V_{REF2}$, the comparator 1742 may change a logic state of the comparison signal COMP. The comparator 1742 may transition the logic-low state of the comparison signal COMP to the logic-high state in the ninth section T9, and the counter 1741, which receives the calibration start enable signal ZQ_Start_EN and the comparison signal COMP of a high logic level, may perform the counting operation by generating the counting pulses CP. The counter 1741 generates the counting pulses CP for less than or equal to the reference counting number, and thus, the counter 1741 may output the counting output signal CT_OUT, which is the same as the counting output signal CT_OUT in the eighth section T8. The calibration control circuit 1740 may keep providing the calibration command signal ZQ_CTR of a high logic level to the calibration circuit 1730.

In a tenth section T10, the counter 1741 may continuously generate the counting pulses CP for more than the reference counting number, and thus, may generate the counting output signal CT_OUT of a low logic level. When the counting output signal CT_OUT of a low logic level is generated, the counting output signal CT_OUT and the calibration start enable signal ZQ_Start_EN may be connected via the AND gate, and the calibration command signal ZQ_CTR of a low logic level may be output.

When the power voltage VDDQ becomes higher than the first reference voltage $V_{REF1}$ as the low power voltage level VDDQ_LOW is increased to the high power voltage level VDDQ_HIGH, the memory device may enter an eleventh section T11. In the eleventh section T11, the hysteresis comparator 1742 may output the comparison signal COMP of a low logic level, and the counter 1741 may stop generating the counting pulses CP. Accordingly, the calibration control circuit 1740 may transmit the calibration command signal ZQ_CTR of a high logic level to the calibration circuit 1730, and the calibration circuit 1730 may resume the ZQ calibration operation.

As is traditional in the field of the present inventive concept, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the inventive concept has been particularly shown and described with reference to embodiments thereof, it will be understood that various changes in form and detail may be made therein without departing from the spirit and scope of the inventive concept as defined by the following claims.

What is claimed is:

1. A memory device, comprising:
    a calibration circuit configured to perform a ZQ calibration operation according to a calibration command signal and a calibration power voltage; and
    a calibration control circuit configured to determine the calibration command signal based on a comparison result obtained by comparing a level of the calibration power voltage with a level of at least one reference voltage.

2. The memory device of claim 1, wherein the calibration control circuit is configured to determine a logic state of the calibration command signal based on the comparison result obtained by comparing the level of the calibration power voltage with the level of the at least one reference voltage for a certain period of time.

3. The memory device of claim 2, wherein the calibration control circuit further comprises:
    a counter configured to output a signal for determining a logic state of the calibration command signal by receiving the comparison result in every counting timing.

4. The memory device of claim 3, wherein the counter is configured to output the calibration command signal having a high logic level when the comparison result of the comparing indicates that the level of the calibration power voltage is equal to or greater than the level of the at least one reference voltage and the comparison result is received in at least one counting timing.

5. The memory device of claim 3, wherein the counter is configured to output the calibration command signal having a low logic level when the comparison result indicates that the level of the calibration power voltage is lower than the level of the at least one reference voltage and the comparison result is received in a counting timing in a number that is equal to or greater than a certain consecutive number of times.

6. The memory device of claim 1, wherein the calibration control circuit is configured to compare the level of the calibration power voltage with different reference voltage levels according to a logic state of the calibration command signal.

7. The memory device of claim 6, wherein the calibration control circuit is configured to compare the level of the calibration power voltage with one of the different reference voltage levels when the calibration command signal is a logic high signal, and transition the calibration command signal to a low logic level when the level of the calibration power voltage is less than the one of the different reference voltage levels.

8. The memory device of claim 6, wherein the calibration control circuit is configured to compare the level of the calibration power voltage with one of the different reference voltage levels when the calibration command signal is a logic low signal, and transition the calibration command signal to a high logic level when the level of the calibration power voltage is equal to or higher than the one of the different reference voltage levels.

9. A calibration control circuit, comprising:
    a comparator configured to obtain a comparison result by comparing a calibration power voltage, which is input to a calibration circuit configured to perform a ZQ calibration operation, with at least one reference voltage; and
    a command signal output unit configured to output a calibration command signal used to determine whether the calibration circuit performs the ZQ calibration operation based on the comparison result.

10. The calibration control circuit of claim 9, wherein the command signal output unit comprises:
    a counter configured to receive the comparison result from the comparator in every counting timing and output the calibration command signal based on the comparison result for a certain period of time.

11. The calibration control circuit of claim 10, wherein the counter is configured to output the calibration command signal having a high logic level when the comparison result indicates that a level of the calibration power voltage is equal to or higher than a level of the at least one reference voltage and the comparison result is received in at least one counting timing.

12. The calibration control circuit of claim 10, wherein the counter is configured to output the calibration command signal having a low logic level when the comparison result indicates that a level of the calibration power voltage is lower than a level of the at least one reference voltage and the comparison result is received in a number that is equal to or greater than a certain consecutive number of times.

13. The calibration control circuit of claim 9, wherein the comparator is configured to compare the calibration power voltage with different reference voltages according to a logic state of the calibration command signal.

14. The calibration control circuit of claim 13, wherein, when the calibration command signal is a logic high signal, the calibration control circuit is configured to transition the calibration command signal to a low logic level when the calibration power voltage is lower than the at least one reference voltage compared to the calibration power voltage.

15. The calibration control circuit of claim 13, wherein, when the calibration command signal is a logic low signal, the calibration control circuit is configured to transition the calibration command signal to high logic level when the calibration power voltage is equal to or higher than the at least one reference voltage compared to the calibration power voltage.

16. An operation method of a memory device, the method comprising:
    comparing a calibration power voltage, which is input to a calibration circuit configured to perform a ZQ calibration operation, with at least one reference voltage; and
    determining a logic state of a calibration command signal used to determine whether the calibration circuit performs the ZQ calibration operation based on a comparison result obtained by comparing the calibration power voltage with the at least one reference voltage.

17. The operation method of claim 16, wherein the logic state of the calibration command signal is determined for a certain period of time by receiving the comparison result in every counting timing of a counter.

18. The operation method of claim 17, wherein determining the logic state of the calibration command signal comprises:
    outputting the calibration command signal having a low logic level when the comparison result indicates that the calibration power voltage is lower than the at least one reference voltage and the comparison result is received in a number that is equal to or greater than a certain consecutive number of times.

19. The operation method of claim 16, wherein the comparing comprises comparing different reference voltages with the calibration power voltage according to the logic state of the calibration command signal.

20. The operation method of claim 19, wherein determining the logic state of the calibration command signal comprises:
- comparing the calibration power voltage with a first reference voltage when the calibration command signal is a logic high signal;
- transitioning the calibration command signal to a low logic level when the calibration power voltage is lower than the first reference voltage;
- comparing the calibration power voltage with a second reference voltage when the calibration command signal is a logic low signal; and
- transitioning the calibration command signal to a high logic level when the calibration power voltage is equal to or higher than the second reference voltage.

* * * * *